(12) United States Patent
Petti

(10) Patent No.: US 8,822,260 B2
(45) Date of Patent: Sep. 2, 2014

(54) ASYMMETRIC SURFACE TEXTURING FOR USE IN A PHOTOVOLTAIC CELL AND METHOD OF MAKING

(71) Applicant: GTAT Corporation, Nashua, NH (US)

(72) Inventor: Christopher J. Petti, Mountain View, CA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 13/785,066

(22) Filed: Mar. 5, 2013

(65) Prior Publication Data

US 2013/0183790 A1    Jul. 18, 2013

Related U.S. Application Data

(63) Continuation of application No. 13/048,955, filed on Mar. 16, 2011, now Pat. No. 8,410,353, which is a continuation of application No. 12/130,241, filed on May 30, 2008, now Pat. No. 7,915,522.

(51) Int. Cl.
  *H01L 31/0236* (2006.01)
(52) U.S. Cl.
  USPC .......................................................... 438/71
(58) Field of Classification Search
  None
  See application file for complete search history.

(56) References Cited

U.S. PATENT DOCUMENTS

| | | |
|---|---|---|
| 3,990,101 A | 11/1976 | Ettenberg et al. |
| 4,137,123 A | 1/1979 | Bailey et al. |
| 4,379,944 A | 4/1983 | Borden et al. |
| 4,954,856 A | 9/1990 | Yamazaki |
| 5,080,725 A | 1/1992 | Green et al. |
| 5,151,385 A | 9/1992 | Yamamoto et al. |
| 6,146,979 A | 11/2000 | Henley et al. |
| 8,049,104 B2 | 11/2011 | Herner et al. |
| 8,178,419 B2 * | 5/2012 | Herner .......................... 438/458 |
| 8,563,352 B2 * | 10/2013 | Hiliali et al. ..................... 438/71 |
| 2003/0178057 A1 | 9/2003 | Fujii et al. |
| 2007/0193624 A1 | 8/2007 | Krasnov |
| 2007/0277874 A1 | 12/2007 | Dawson-Elli et al. |
| 2008/0070340 A1 | 3/2008 | Borrelli et al. |
| 2008/0105293 A1 | 5/2008 | Lu et al. |
| 2008/0105298 A1 | 5/2008 | Lu et al. |
| 2008/0105299 A1 | 5/2008 | Krasnov |
| 2008/0105302 A1 | 5/2008 | Lu et al. |
| 2008/0107799 A1 | 5/2008 | Lu et al. |
| 2008/0163929 A1 | 7/2008 | Krasnov |
| 2008/0196761 A1 | 8/2008 | Nakano et al. |

(Continued)

OTHER PUBLICATIONS

Notice of Allowance and Fees dated Apr. 9, 2013 for U.S. Appl. No. 13/211,258.

(Continued)

*Primary Examiner* — Seahvosh Nikmanesh
(74) *Attorney, Agent, or Firm* — The Mueller Law Office, P.C.

(57) ABSTRACT

A novel surface texturing provides improved light-trapping characteristics for photovoltaic cells. The surface is asymmetric and includes shallow slopes at between about 5 and about 30 degrees from horizontal as well as steeper slopes at about 70 degrees or more from horizontal. It is advantageously used as either the front or back surface of a thin semiconductor lamina, for example between about 1 and about 20 microns thick, which comprises at least the base or emitter of a photovoltaic cell. In embodiments of the present invention, the shallow slopes are formed using imprint photolithography.

13 Claims, 22 Drawing Sheets

(56) References Cited

U.S. PATENT DOCUMENTS

| | | |
|---|---|---|
| 2008/0223430 A1 | 9/2008 | Krasnov et al. |
| 2008/0223436 A1 | 9/2008 | Den Boer et al. |
| 2008/0302414 A1 | 12/2008 | Den Boer et al. |
| 2009/0142874 A1 | 6/2009 | Arai |
| 2010/0181566 A1 | 7/2010 | Lee |
| 2011/0088762 A1 | 4/2011 | Singh et al. |
| 2011/0162688 A1* | 7/2011 | Petti ............................ 136/244 |
| 2011/0180133 A1 | 7/2011 | Verhaverbeke et al. |
| 2012/0164785 A1 | 6/2012 | Blaydes et al. |
| 2012/0167969 A1 | 7/2012 | Petti |
| 2012/0205655 A1* | 8/2012 | Herner ............................ 257/53 |

OTHER PUBLICATIONS

Campbell and Green, Light trapping properties of pyramidally textured surfaces, Journal of Applied Physics, Jul. 1987, vol. 62, No. 1, pp. 243-249.

Chang, et al., Fabrication of Saw-tooth Diffraction Gratings using Nanoimprint Lithography, 47th International Conference on Electron, Ion, and Photo Beam Technology & Nanofabrication, May 2003, Tampa, Florida, pp. 1-16.

Lee, "Electrical and optical properties of ZnO transparent conducting films by the sol-gel method" Journal of Crystal Growth, vol. 247, Issue 1-2, Jan. 2003, pp. 119-125.

Nelson, The Physics of Solar Cells, Imperial College Press, 2006, Chapter 9.

Notice of Allowance dated Sep. 12, 2011 for U.S. Appl. No. 12/571,415.

Office Action dated Dec. 26, 2012 for U.S. Appl. No. 13/211,258.

Sobajima et al., "Novel Light-Trapping Structure Having Smooth Surface for Silicon Thin-Film Solar Cell", 33rd IEEE Photovoltaic Specialists Conference, May 2008.

Weber et al., A novel silicon texturization method based on etching through a silicon nitride mask, Progress in Photovoltaics: Research and Applications, Oct. 2005, 13:691-695, published online Oct. 5, 2005 in Wiley InterScience, www.interscience.wiley.com.

* cited by examiner

Embodiment of 12/026530

Embodiment of 12/026530

Embodiment of 12/026530

Embodiment of 12/026530

ASYMMETRIC SURFACE TEXTURING FOR USE IN A PHOTOVOLTAIC CELL AND METHOD OF MAKING

RELATED APPLICATIONS

This application is a continuation of U.S. Pat. No. 8,410,353, issued Apr. 2, 2013; which is a continuation of U.S. Pat. No. 7,915,522, issued Mar. 29, 2011; both of which are incorporated by reference for all purposes.

BACKGROUND OF THE INVENTION

The invention relates to a novel surface texturing to enhance trapping of light in a photovoltaic cell, and methods of making such texturing.

Light enters a photovoltaic cell and generates current. If any light passes entirely through the cell and escapes without being absorbed, cell efficiency is reduced. Thus methods are employed to increase travel distance of light within a photovoltaic cell, including reflecting light from the back surface of the cell and bending light at either the front or back surface. One method to bend light as it enters the cell is to texture the incident surface so that light which enters normal to the cell strikes a face on the surface at an angle which is not normal to the face, and is diffracted as it enters the cell.

In conventional monocrystalline silicon photovoltaic cells, it is well-known to texture the surface using a crystallographic etch. One commonly used etch produces relatively steep faces sloped at 54.7 degrees from horizontal, which provides effective surface texturing for a wafer which is, for example, 150 microns thick or more. In a photovoltaic cell comprising a significantly thinner silicon lamina, however, this style of texturing allows reflected light to escape and presents problems with cell fabrication.

There is a need, therefore, for a method of surface texturing appropriate to a photovoltaic cell comprising a thinner semiconductor lamina.

SUMMARY OF THE PREFERRED EMBODIMENTS

The present invention is defined by the following claims, and nothing in this section should be taken as a limitation on those claims. In general, the invention is directed to a method of forming a surface with an asymmetric profile including shallow and steep faces. This surface texturing is advantageously used in a photovoltaic cell comprising a thin semiconductor lamina.

A first aspect of the invention provides for a photovoltaic cell comprising a semiconductor lamina having a first textured surface and a second surface substantially parallel to the first textured surface, wherein at least 50 percent of the first textured surface area is first faces and second faces, wherein the first faces are at an angle between about 5 and about 30 degrees from horizontal, and the second faces are at least seventy degrees from horizontal, wherein the photovoltaic cell comprises the semiconductor lamina.

Another aspect of the invention provides for a photovoltaic cell comprising a semiconductor lamina having a first textured surface and a second surface substantially parallel to the first textured surface, wherein at least 50 percent of the first textured surface comprises first faces and second faces, wherein the first faces are at an angle between ten and twenty-five degrees from horizontal, and the second faces are at least seventy degrees from horizontal, wherein distribution of the first faces is not periodic, and wherein the photovoltaic cell comprises the semiconductor lamina.

Another aspect of the invention provides for a method to form a photovoltaic cell, the method comprising fabricating a negative template having a negative template surface, the negative template surface having negative template relief; providing a semiconductor lamina having a lamina surface; placing the negative template surface adjacent to the lamina surface, wherein photoresist is disposed between the negative template surface and the lamina surface; and forming lamina relief on the lamina surface, wherein the lamina relief is substantially the inverse of the negative template relief, with or without vertical exaggeration or compression, wherein the photovoltaic cell comprises the semiconductor lamina.

An embodiment of the invention provides for a method to form a photovoltaic cell, the method comprising defining a cleave plane in a semiconductor donor body; affixing a first surface of the semiconductor donor body to a receiver element; cleaving a semiconductor lamina from the semiconductor donor body along the cleave plane, wherein the semiconductor lamina remains affixed to the receiver element, wherein the cleaving step creates a second surface of the semiconductor lamina substantially parallel to the first surface; and treating the second surface wherein, after the treating step, at least 50 percent of the second surface is first faces and second faces, wherein the first faces are at an angle between ten and twenty-five degrees from horizontal, and the second faces are at least seventy degrees from horizontal, wherein the first faces are at an angle between ten and twenty-five degrees from horizontal, and the second faces are at least seventy degrees from horizontal, wherein the photovoltaic cell comprises the semiconductor lamina.

Another aspect of the invention provides for a first photovoltaic assembly comprising a semiconductor lamina having a thickness between about 0.5 and about 20 microns, the semiconductor lamina having a first textured surface and second surface substantially parallel to the first textured surface, wherein at least 50 percent of the first textured surface area is first faces and second faces, wherein the first faces are at an angle between ten and twenty-five degrees from horizontal, and the second faces are at least seventy degrees from horizontal, wherein the semiconductor lamina has a lamina widest dimension; and a receiver element having a receiver widest dimension, wherein the semiconductor lamina is affixed to the receiver element at the second surface, wherein the receiver widest dimension does not exceed the lamina widest dimension by more than about 50 percent, wherein the first photovoltaic assembly comprises a photovoltaic cell.

Yet another aspect of the invention provides for a photovoltaic cell, wherein incident light enters the photovoltaic cell at a front surface, and at least a fraction of the incident light is reflected from a back surface, wherein the incident light is reflected or refracted at a textured surface, wherein the textured surface is the front surface, the back surface, or a third surface between the front surface and the back surface, wherein at least 50 percent of the textured surface comprises first faces and second faces, wherein the first faces are at an angle between ten and twenty-five degrees from horizontal, and the second faces are at least seventy degrees from horizontal.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 10a, 10c, and 10d are cross-sectional views. FIG. 10b is a plan view.

DETAILED DESCRIPTION OF THE PREFERRED EMBODIMENTS

Figure 1:
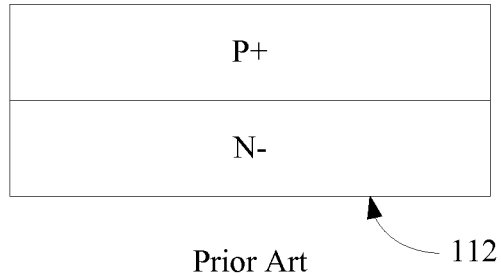
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons will knock electrons from the conduction band to the valence band, creating electron-hole pairs. Within the electric field at the p-n junction, electrons tend to migrate toward the n region of the diode, while holes migrate toward the p region, resulting in current. This current can be called the photocurrent. Typically the dopant concentration of one region will be higher than that of the other, so the junction is either a p−/n+ junction (as shown in FIG. 1) or a p+/n− junction. The more lightly doped region is known as the base of the photovoltaic cell, while the more heavily doped region is known as the emitter. Most carriers are generated within the base, and it is typically the thickest portion of the cell. The base and emitter together form the active region of the cell.

Figure 2A:
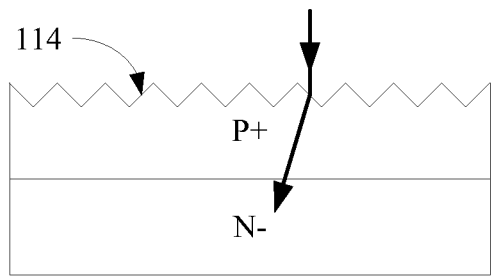
FIGS. 2a and 2b are cross-sectional views of surface texturing in prior art photovoltaic cells.
Figure 2B:
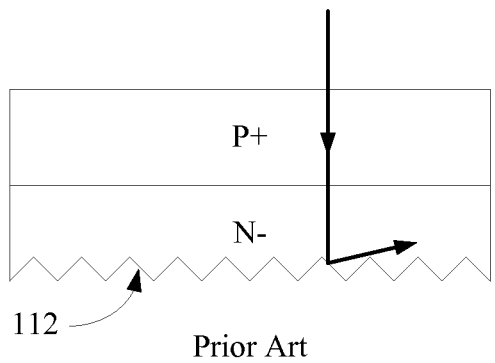

Some incident light may pass all the way through the cell without creating any electron-hole pairs, failing to generate any photocurrent and reducing the efficiency of the cell. Referring to FIG. 1, to avoid allowing light to escape, typically the back surface 112 of the cell is reflective, so that light that passes through the cell is reflected back into the cell from back surface 112. It is also well known to texture front surface 114 as in FIG. 2a, which will cause incident light to be diffracted, as shown. Alternatively back surface 112 may be textured, as in FIG. 2b, changing the angle of light upon reflection. Either technique serves to increase travel length of light within the cell, improving cell efficiency. Ideally surface texturing will alter the path of light so that all light is internally reflected, and none escapes.

Figure 3:
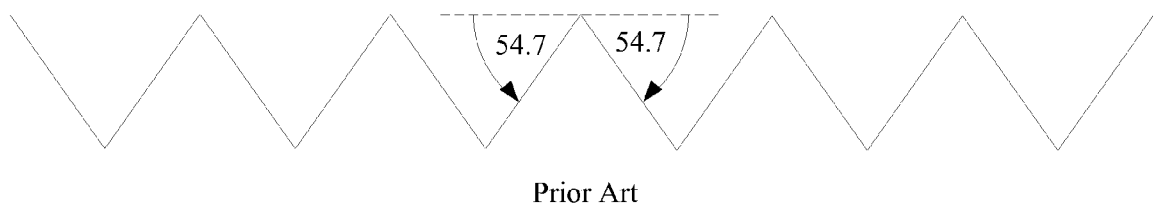
FIG. 3 is a cross-sectional view of prior art surface texturing in monocrystalline silicon photovoltaic cells.

In conventional monocrystalline silicon photovoltaic cells, the most common way to create texture to bend and trap light is to perform a crystallographic etch such as a KOH etch on the wafer surface. This etch is selective, preferentially etching the (111) crystallographic planes. The resulting surface, as shown in FIG. 3, is symmetric and includes faces sloping 54.7 degrees from horizontal, the faces sloping in opposite directions. The relief may be periodic or non-periodic, and the depth of this surface relief is typically on the order of ten microns.

Figure 4:
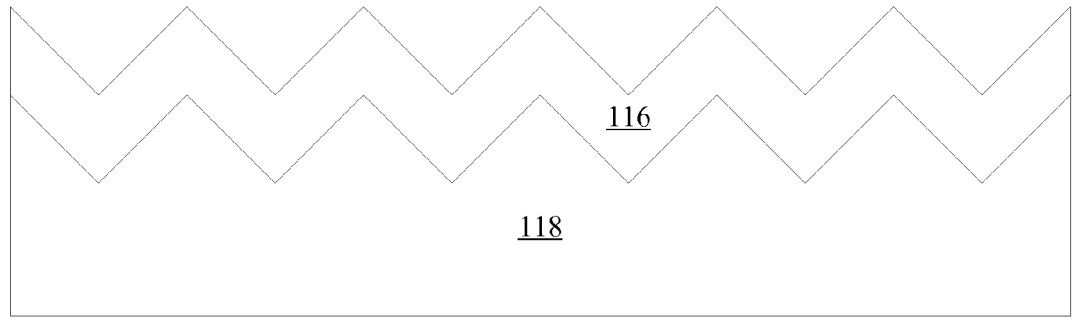
FIG. 4 is a cross-sectional view of prior art surface texturing in amorphous silicon photovoltaic cells.

Photovoltaic cells can be formed from deposited or non-deposited semiconductor material. Deposited semiconductor material is generally silicon, and is formed at relatively low temperature such that the resulting film is amorphous, nanocrystalline, or microcrystalline. The film has either no crystals, or has very small crystals in an amorphous matrix. The crystal size is very small, 100 angstroms in microcrystalline films or, in nanocrystalline films, even smaller. These deposited films are often relatively thin, for example two microns thick or less. Such cells have lower efficiency, but are relatively inexpensive to manufacture. Deposited films lack the regular crystallographic planes of monocrystalline silicon, and thus cannot be textured using a crystallographically selective etch. Surface texture is often provided for deposited films by depositing the film 116 onto a textured substrate 118, as shown in FIG. 4.

Photovoltaic cells are also formed from non-deposited material, most frequently monocrystalline, polycrystalline, or multicrystalline silicon. A monocrystalline silicon wafer, of course, is formed of a single silicon crystal, while the term multicrystalline typically refers to semiconductor material having crystals that are on the order of a millimeter in size. Polycrystalline semiconductor material has smaller grains, on the order of a thousand angstroms. Monocrystalline, multicrystalline, and polycrystalline material is typically entirely or almost entirely crystalline, with no or almost no amorphous matrix. For example, non-deposited semiconductor material is at least 80 percent crystalline.

Photovoltaic cells fabricated from non-deposited material are conventionally formed of wafers sliced from a silicon ingot. Current technology does not allow wafers of less than about 150 microns thick to be fabricated into cells economically, and at this thickness a substantial amount of silicon is wasted in kerf, or cutting loss. Silicon solar cells need not be this thick to be effective or commercially useful. A large portion of the cost of conventional solar cells is the cost of silicon feedstock. Photovoltaic cells formed from non-deposited, substantially crystalline silicon have higher cell efficiency than those formed of deposited silicon, and are generally more expensive to fabricate.

Figure 5A:
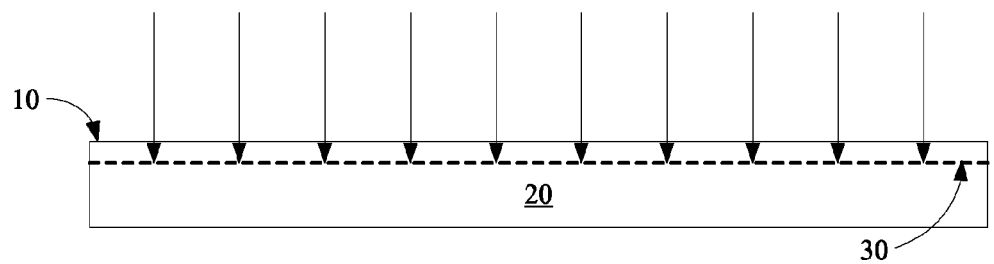
FIGS. 5a-5d are cross-sectional views illustrating stages in formation of a thin semiconductor lamina for use in a photovoltaic cell as described in Sivaram et al., U.S. patent application Ser. No. 12/026,530.
Figure 5B:
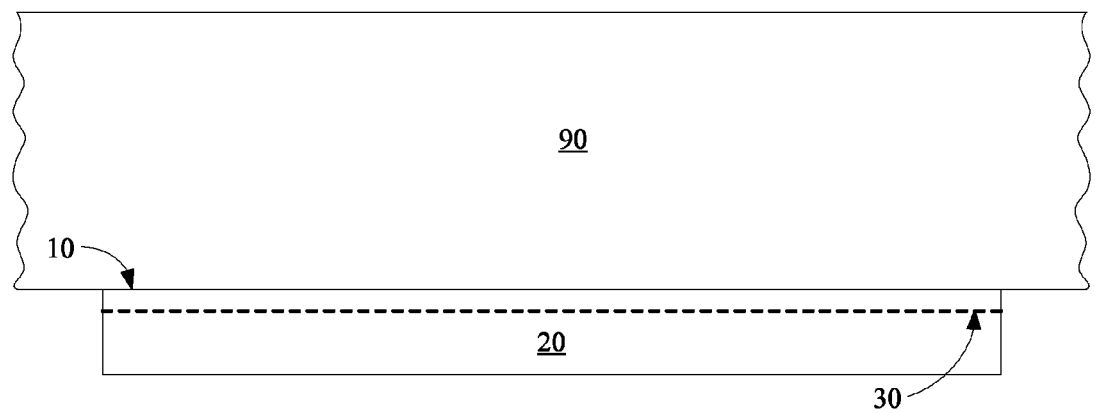
Figure 5C:
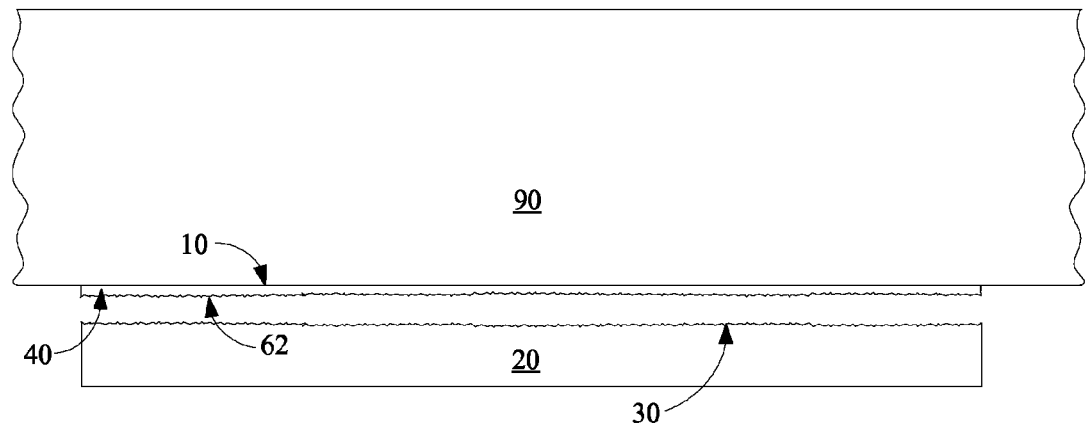
Figure 5D:
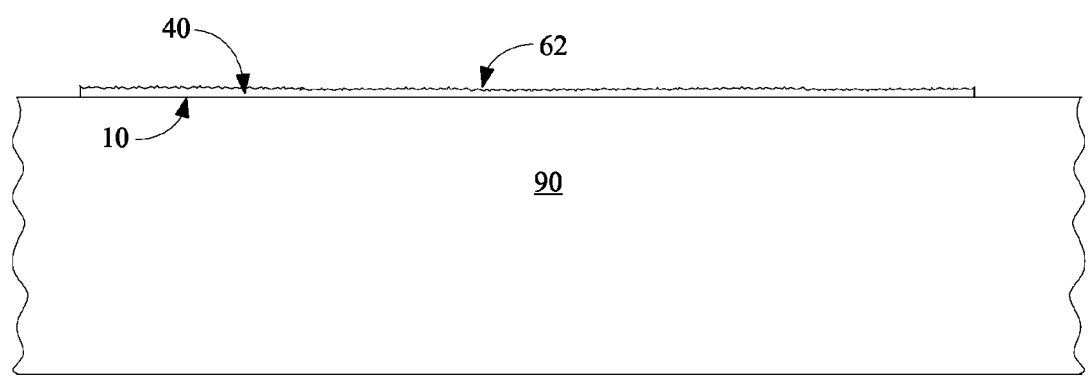

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 5a, in embodiments of Sivaram et al., a semiconductor donor wafer 20 is implanted with one or more species of gas ions, for example hydrogen or helium ions. The implanted ions define a cleave plane 30 within the semiconductor donor wafer. As shown in FIG. 5b, donor wafer 20 is affixed at first surface 10 to receiver 90. Referring to FIG. 5c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 50 microns thick, in some embodiments between about 1 and about 10 microns thick, though any thickness within the named range is possible. FIG. 5d shows the structure inverted, with receiver 90 at the bottom, as during operation in some embodiments.

Using the methods of Sivaram et al., photovoltaic cells are formed of thinner semiconductor laminae without wasting silicon through kerf loss or by formation of an unnecessarily thick wafer, thus reducing cost. The same donor wafer can be reused to form multiple laminae, further reducing cost, and may be resold after exfoliation of multiple laminae for some other use. The cost of the hydrogen or helium implant may be kept low by methods described in Parrill et al., U.S. patent application Ser. No. 12/122,108, "Ion Implanter for Photovoltaic Cell Fabrication," owned by the assignee of the present invention, filed May 16, 2008, and hereby incorporated by reference. Because the lamina produced by Sivaram et al. is relatively thin, surface texturing to enhance bending and trapping of light may be particularly important.

In some embodiments of Sivaram et al., the lamina is formed of monocrystalline silicon. The KOH etch conventionally used to create surface texture in photovoltaic cells formed of conventional (100)-oriented monocrystalline silicon wafers, which may be 150, 200, 250 or more microns thick, however, is not an attractive option for cells formed using the laminae formed by Sivaram et al. As mentioned earlier, the depth of surface relief formed by a KOH etch is on the order of ten microns, while the silicon lamina of Sivaram et al. may be only one to two microns thick.

Figure 6A:
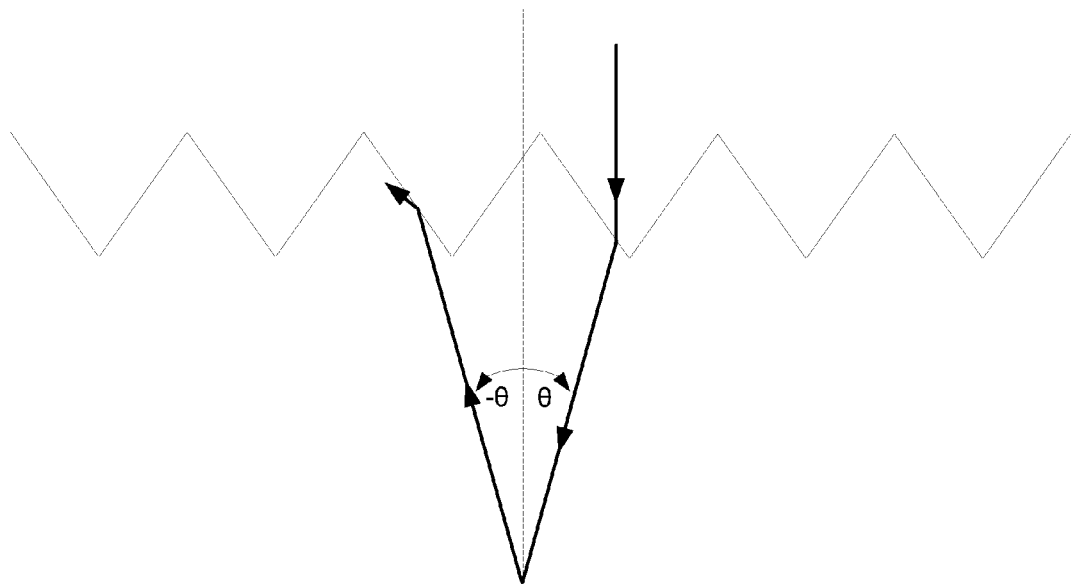
FIGS. 6a and 6b are cross-sectional views illustrating reflected light escaping using prior art surface texturing.
Figure 6B:
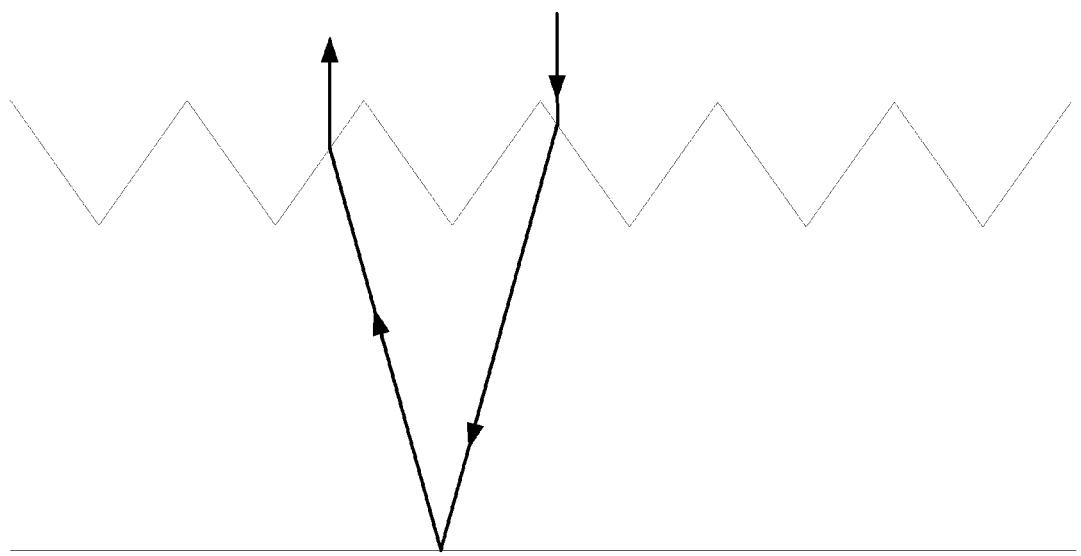

An additional disadvantage exists. FIG. 6a shows a surface formed by a crystallographic etchant such as KOH. The etch forms symmetric triangles having two opposing faces, each sloping 54.7 degrees from horizontal. Light enters a first face and is diffracted at the surface, as shown. Assuming the back surface is reflective and flat, light reaching the back surface of the cell at an angle of θ from cell normal will reapproach the surface at −θ from cell normal. If this reflected light reaches the surface on a face parallel to the first face at which it entered, as in FIG. 6a, it will be internally reflected from the face. If, however, this reflected light reaches the surface on a face having the opposite slope, as in FIG. 6b, it will escape the cell and be lost.

Because photovoltaic cells made from conventional monocrystalline silicon wafers are typically more than 150 microns thick, most light is absorbed either during the initial pass through the wafer or following reflection from the back surface, and loss through opposite-sloping faces in a symmetrically textured surface may not be a serious problem. In a lamina which may be ten microns thick or less, or even two microns thick or less, however, it becomes more important to avoid such a loss.

Figure 7A:
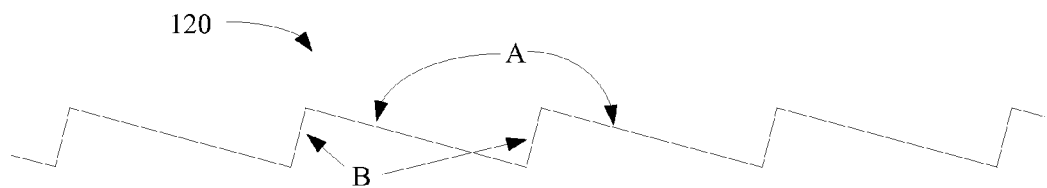
FIGS. 7a and 7b are cross-sectional views illustrating surface texturing according to embodiments of the present invention, with improved light trapping.

In aspects of the present invention, a novel surface profile is used to improve light trapping in a photovoltaic cell. As shown in FIG. 7a, a textured surface is formed with an asymmetric profile made up of first faces A sloping at a shallow angle and second faces B sloping at a steeper angle. It will be seen that shallow faces A are significantly longer than steep faces B. After reflection from the back surface, reflected light is much more likely to strike shallow, longer face A and be internally reflected than to strike steep, shorter face B.

Figure 7B:
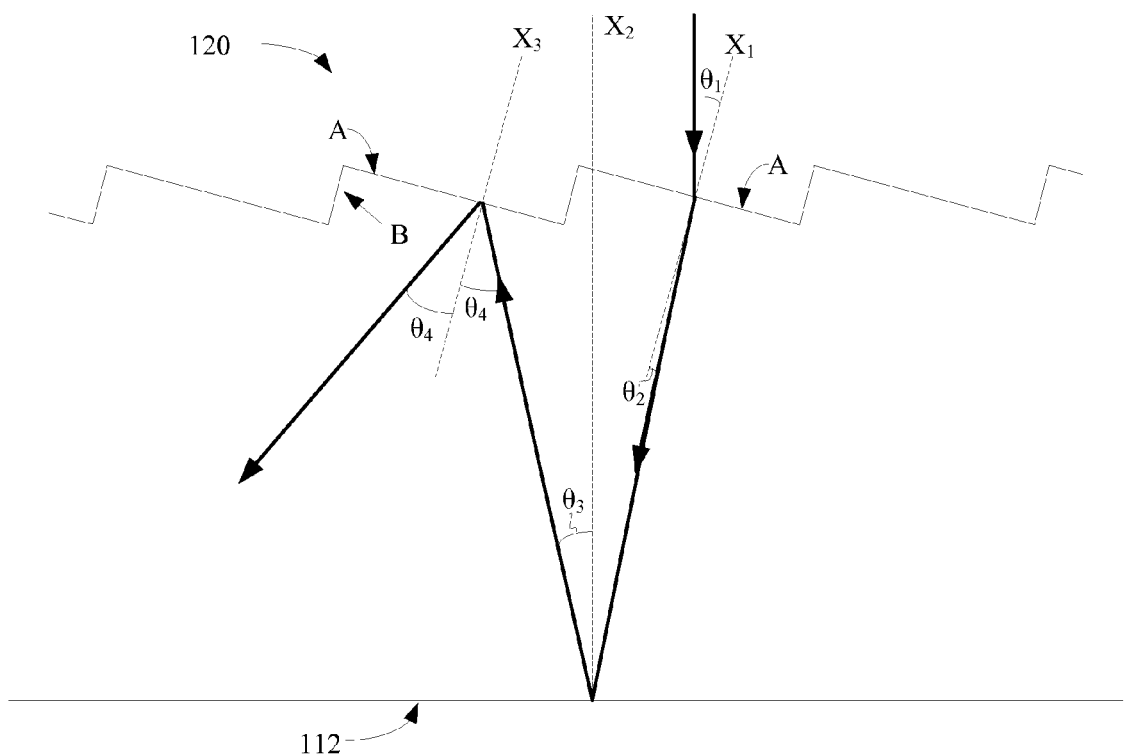

In one example, referring to FIG. 7b, shallow faces A slope at an angle about 15 degrees from horizontal. Suppose incident light enters the cell normal to the cell itself. Upon entering the surface, light is diffracted according to Snell's law:

$$n_1 \sin \theta_1 = n_2 \sin \theta_2$$

It will be seen that $\theta_1$ and $\theta_2$ are measured relative to the normal of shallow face A, which is shown as dashed line $X_1$. Note that $\theta_1$ is the same as the angle at which shallow face A slopes from horizontal. The index of refraction $n_1$ for air is 1, and the index of refraction $n_2$ for silicon is between about 3.5 and about 4, depending on the wavelength. Calculation shows that if $\Theta_1$ is about 15 degrees, diffracted angle $\theta_2$ is about 4 degrees, while $\theta_3$ measured from cell normal $X_2$ after reflection from back surface 112 is about 11 degrees. Because of their relative lengths and respective orientations, light reflected from back surface 112 is much more likely to reencounter surface 120 at a shallow face A than at a steep face B. In this example reflected light will strike shallow face A at $\theta_4$, which is 11+15=26 degrees from the normal (indicated by dashed line $X_3$) to shallow face A. Due to the high index of refraction of silicon relative to that of air, any light striking face A at an angle more than about 16 degrees from normal to the face will not escape, and will be internally reflected. On subsequent bounces, the angle to cell normal, and the path length, increases, and most light is internally reflected and does not escape the cell.

Shallow faces A are between about 5 and about 30 degrees from horizontal, for example between about 10 and about 25 degrees from horizontal, in some embodiments between about 10 and about 15 degrees from horizontal. When formed at the surface of a relatively thin photovoltaic cell, this shallow angle provides the additional advantage that it can be formed at a relatively large pitch without requiring a large sacrifice of cell thickness. In addition, smaller pitch faces may be more expensive to fabricate. Steeper faces B are preferably at least 70 degrees from horizontal, for example, about 75, 80, or 85 degrees from horizontal, or steeper faces B may be substantially vertical or in some embodiments may be reentrant.

Figure 8:
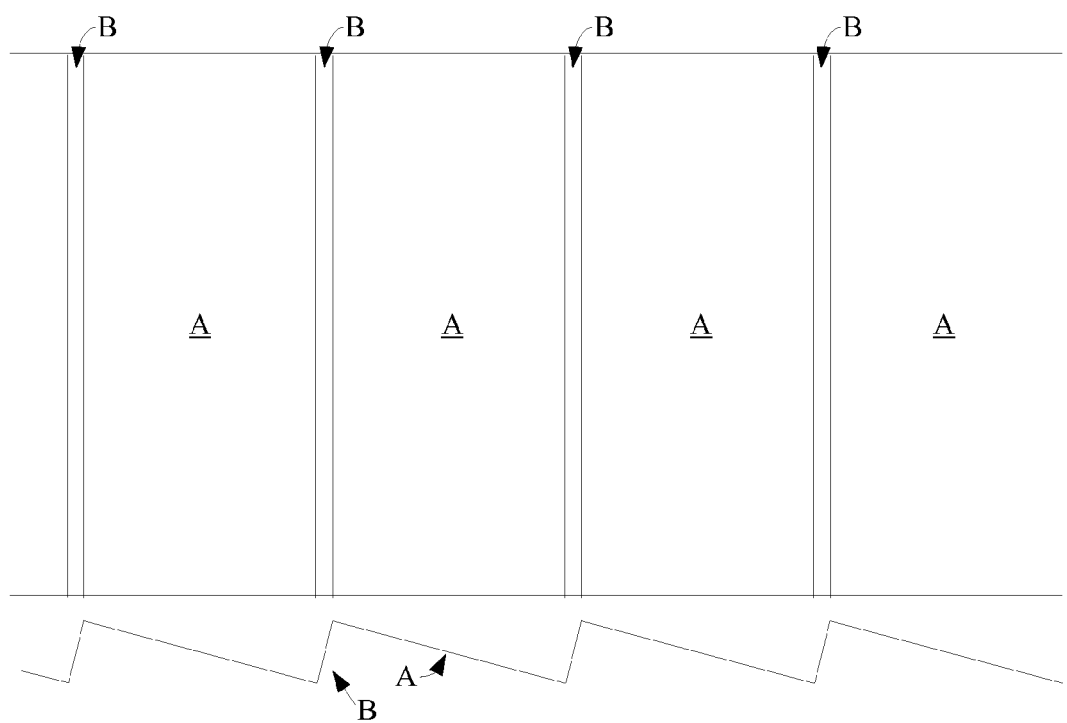
FIG. 8 is a plan view, including a profile, of a textured surface according to an aspect of the present invention having a one-dimensional pattern.
Figure 9:
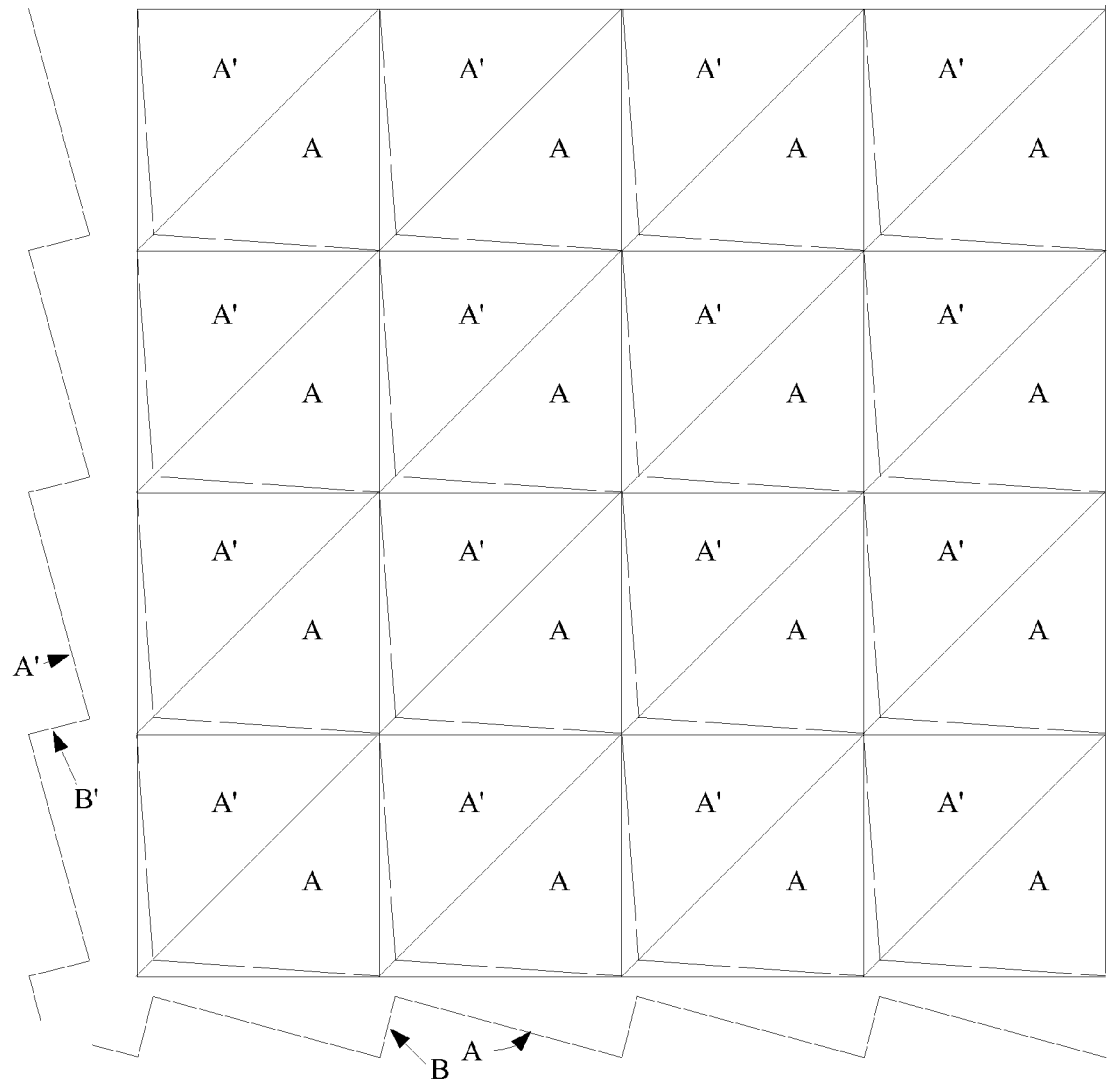
FIG. 9 is a plan view, including a profile in each dimension, of a textured surface according to an aspect of the present invention having a two-dimensional pattern.

Textured surfaces according to aspects of the present invention may be periodic, with the faces spaced at regular intervals, or need not be. In some embodiments, the texturing is one-dimensional, and all shallow faces A have the same orientation. Steep faces B also all have the same orientation. FIG. 8 shows such a textured surface viewed from above, with the corresponding cross-section shown below. In other embodiments, the texturing is two-dimensional, and shallow faces A and A' appear in two different orientations, as in FIG. 9, also viewed from above, with corresponding cross-sections shown below and at left. Steep faces B and B' also occur at two different orientations.

Examples will be provided of fabrication of one- and two-dimensional patterns formed in textured surfaces, which may be periodic or not, according to various embodiments of the invention. Examples will further be provided of texturing according to the present invention as applied to fabrication of a photovoltaic cell including a semiconductor lamina, where the semiconductor lamina is formed according to methods described in Sivaram et al. For completeness, many materials, conditions, and steps will be described. It will be understood, however, that many of these details can be modified, augmented, or omitted while the results fall within the scope of the invention.

EXAMPLE

Texturing with Two-Dimensional Periodic Orientation

Figure 10A:
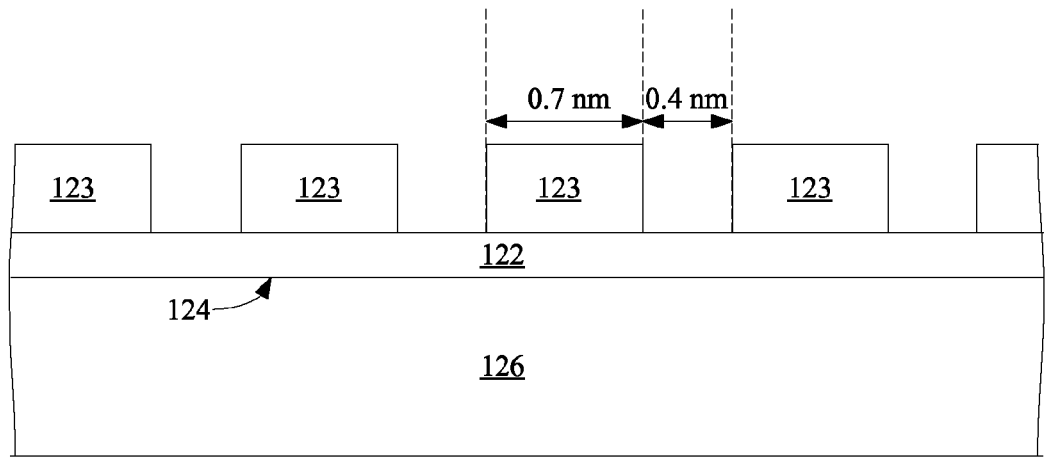
FIGS. 10a-10d are views showing stages in formation of a textured surface according to an aspect of the present invention having a two-dimensional pattern.

Texturing begins with fabrication of a positive template formed in a monocrystalline semiconductor wafer. In the present example, the wafer is sliced from a (111)-oriented silicon wafer at between about 5 to 30 degrees, preferably 10 to 25 degrees, for example 15 degrees from the (111) crystallographic plane. Turning to FIG. 10a, surface 124 of positive template wafer 126 is untextured, with substantially no relief.

A thickness of a material 122 having good etch selectivity with silicon is formed on surface 124 of positive template wafer 126. For example, material 122 may be 50 nm of silicon dioxide, though other appropriate materials and thicknesses may be selected.

Figure 10B:
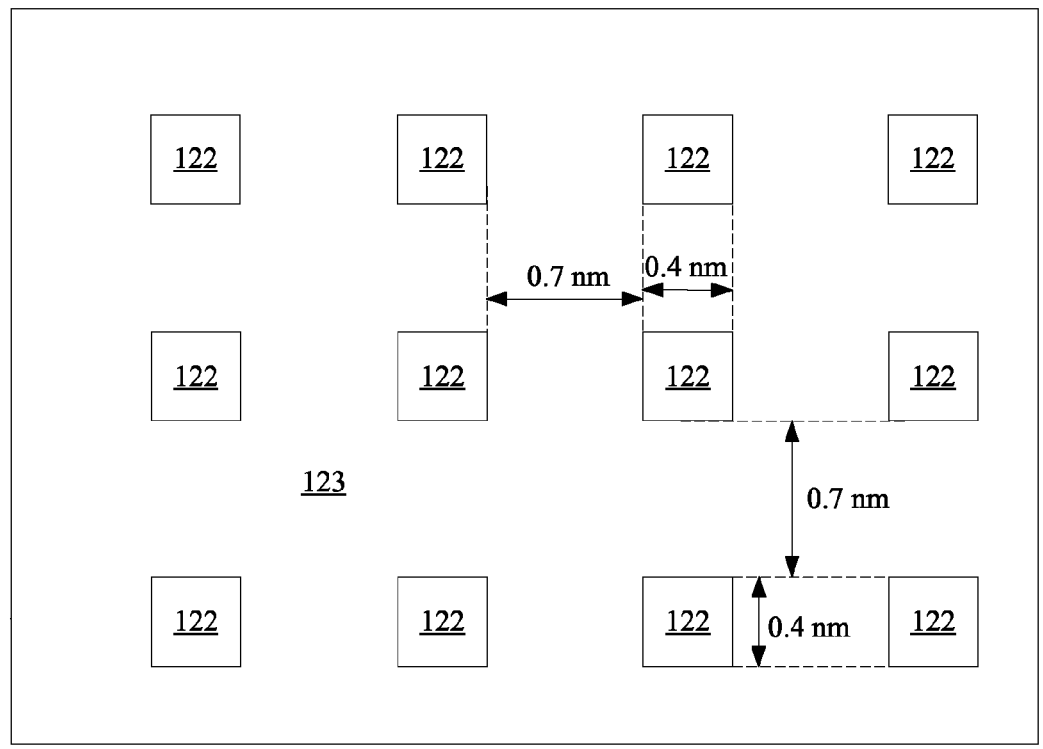
Figure 10C:
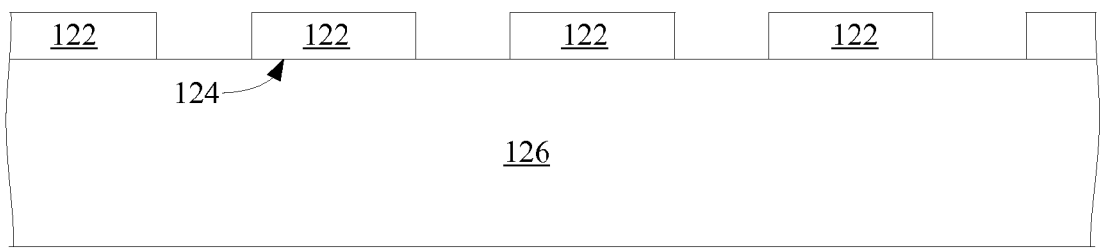

Next a layer of photoresist 123 is formed on silicon dioxide layer 122 and is photolithographically patterned to form square holes in photoresist 123. FIG. 10b illustrates the structure viewed from above. In one embodiment, the squares are 0.4 microns on a side, with 0.7 micron spacing between, though alternate sizes and spacing may be selected. The size and pitch may be the same in two dimensions, or may be different. An isotropic etch, for example using HF, transfers the pattern from photoresist 123 into silicon dioxide layer 122, and photoresist 123 is stripped, as shown in FIG. 10c.

Figure 10D:
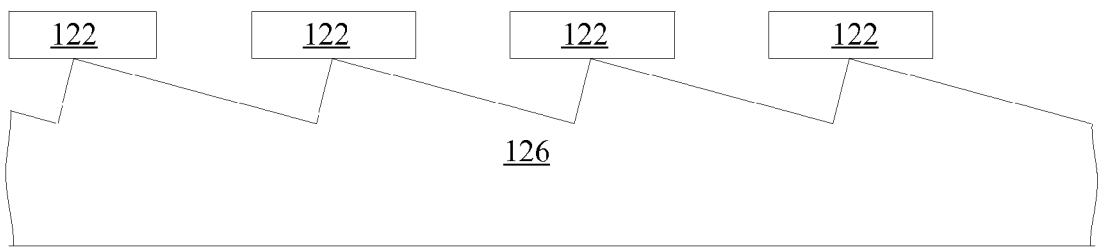

Turning to FIG. 10d, next a mildly crystallographically selective etchant is used, for example having (100):(111) etch selectivity of about 1:1.5. An appropriate etchant would be a tetramethylammoniumhydroxide and $H_2O$ etch, with a ratio of about 2:98, though other appropriate etchants may be selected.

Because this etchant has a low crystallographic selectivity, the etch results in significant undercut beneath silicon dioxide layer 122, as shown in FIG. 10d. This etch is timed such that ideally no flat surface remains between sloped surfaces, though some rounding may occur. Preferably the deepest point, the maximum peak-to-valley distance, after etch is about 3000 angstroms or less from the original surface. After etch is complete, what remains of silicon dioxide layer 122 is removed.

Figure 10E:
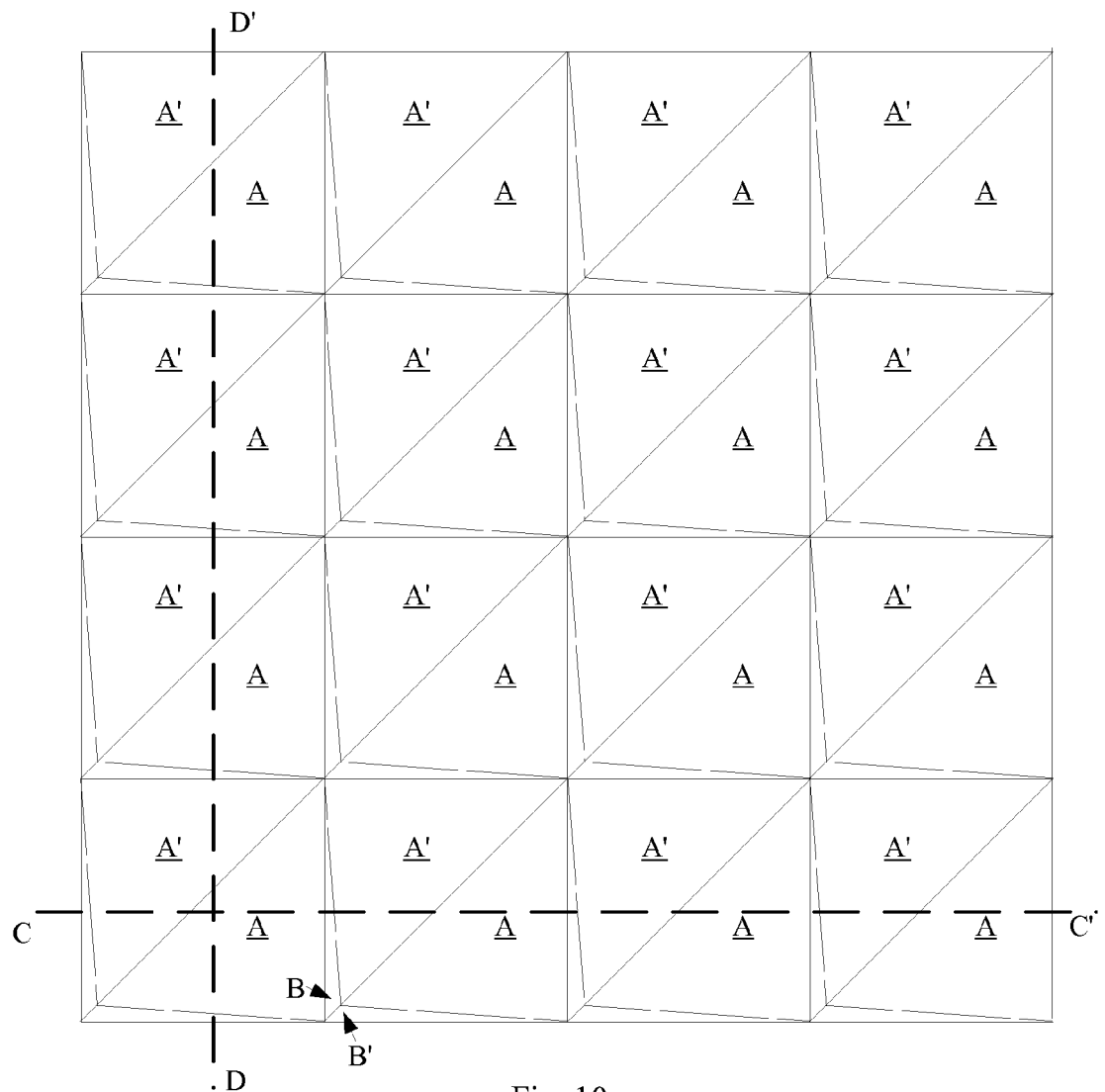
FIG. 10e is a plan view of a textured surface having a two-dimensional pattern according to an aspect of the present invention.
Figure 10F:
FIG. 10f is a cross-sectional view of the surface of FIG. 10e along line C-C'.
Figure 10G:
FIG. 10g is a cross-sectional view of the surface of FIG. 10e along line D-D'.

After etch, the resulting textured surface is shown viewed from above in FIG. 10e. FIG. 10f shows a cross-section of positive template wafer 126 along line C-C', and FIG. 10g shows a cross-section of positive template wafer 126 along line D-D'. Faces A and A' both slope at about 15 degrees from horizontal, while faces B and B' are much steeper, for example more than 70 degrees from horizontal. In some embodiments, faces B and B' are nearly vertical, and may be slightly undercut, for example by about 4 or 5 degrees. If the etch has been timed such that no horizontal surfaces remain, the positive template surface, after etch, is made up entirely of first shallow faces and second steep faces. In alternative embodiments, the etched faces may not meet perfectly, and some horizontal or other faces may remain.

After etch, the result is a surface which is at least 50 percent first faces and second faces, preferably nearly 100 percent. First faces have shallow angles, second faces have steep angle. The first faces include a first subset of first faces A having a first orientation and a second subset of first faces A' having a second orientation different from first orientation, for example rotated at about 90 degrees. The first subset of first faces comprises about half of the first faces. The pattern is periodic with a pitch between about 0.3 micron and about 3 microns, for example about 1.1 micron.

This first positive template 126 is formed from monocrystalline silicon, and could itself be further processed to fabricate a photovoltaic cell with very good internal reflection properties. Recall, however, that it was formed from a (111)-oriented wafers cut at a bias; such a wafer is non-standard and therefore relatively expensive. By using the textured wafer just formed as a template, wafers having substantially the same relief can be formed in standard (100)-oriented silicon wafers, which are significantly cheaper.

Figure 11A:
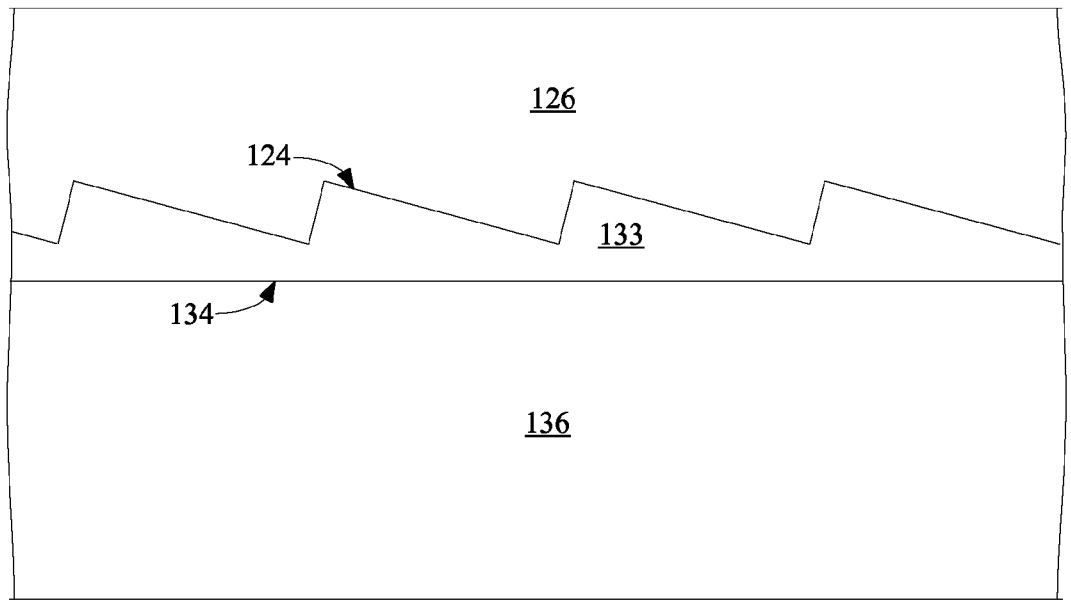
FIGS. 11a and 11b are cross-sectional views illustrating transfer of the inverse relief of FIG. 10e to a negative template surface using imprint photolithography.

Referring to FIG. 11a, next a negative template wafer 136 is provided. This negative template wafer 136 is preferably formed of a transparent or semitransparent material, for example silica, and has a negative template surface 134 that begins with substantially no relief. A layer of photoresist 133 appropriate for imprint photolithography is formed on surface 134 of negative template 136. Textured surface 124 of positive template 126 is placed adjacent to surface 134 of negative resist template 136 with photoresist 133 between them, as shown in FIG. 11a.

While photoresist 133 is disposed between negative template surface 134 and positive template surface 124, the assembly is exposed to UV light to cure photoresist 133; recall that negative template 134 is preferably transparent. After curing, positive template 126 is removed, leaving a negative relief pattern in photoresist 133. Positive template surface 124 may have been previously treated for easy release.

Figure 11B:
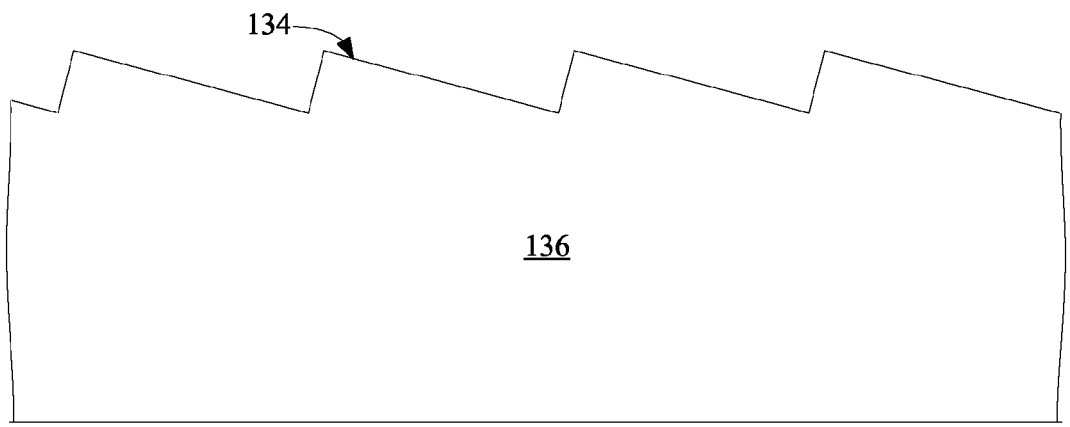

Next a timed etch is performed to transfer the negative relief formed in photoresist 133 to negative template surface 134. The pattern in negative template surface 134 is substantially the inverse of the relief formed in positive template surface 124. If the selectivity of photoresist 133 to silica is 1:1, there will be no vertical exaggeration or compression between the relief formed in photoresist 133 and the negative relief formed in negative template surface 134. If there is some etch selectivity, however, there will be some vertical exaggeration or compression. For simplicity, this description will assume 1:1 selectivity. Negative template 136 is shown in FIG. 11b.

Summarizing, relief on negative template surface 134 was formed by curing the photoresist while it is disposed between the negative template and the lamina; and etching the photoresist.

Next an inverse of negative relief formed in negative template surface 134 will be transferred using imprint photolithography from negative template surface 134 to the surface of a semiconductor body, for example a standard (100) silicon wafer, or a thin lamina cleaved from such a wafer. This example will describe the use of a silicon lamina, though a wafer or some other semiconductor body may be used instead. This lamina is preferably formed of substantially crystalline material, for example monocrystalline, multicrystalline, or polycrystalline silicon.

Figure 12A:
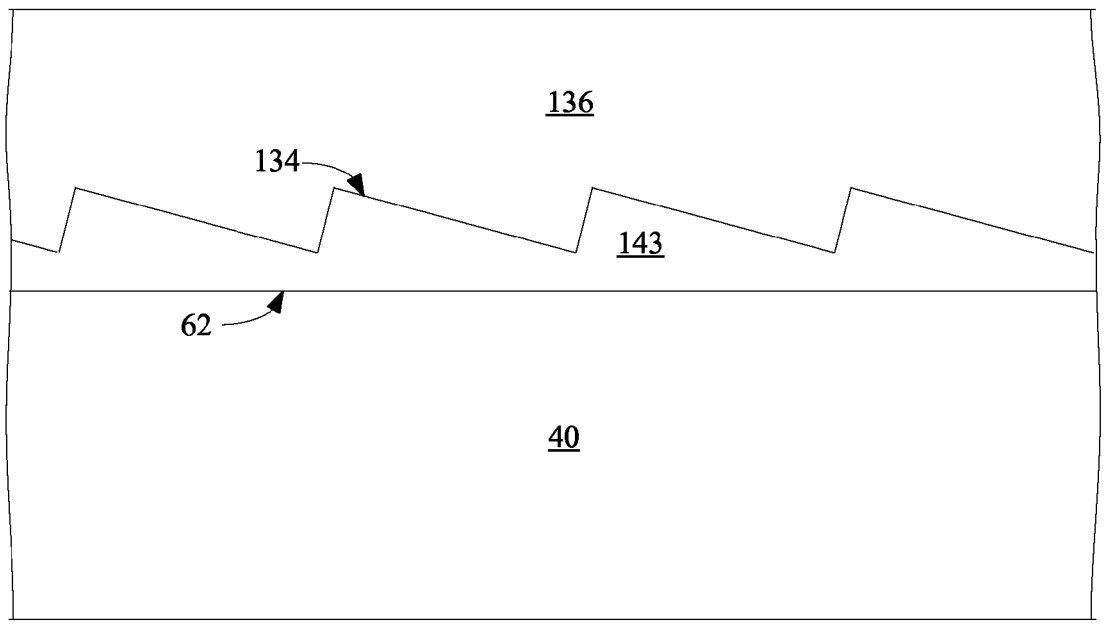
FIGS. 12a and 12b are cross-sectional views illustrating transfer of the inverse relief of the negative template surface to the surface of a semiconductor lamina using imprint photolithography.

Turning to FIG. 12*a*, a layer of photoresist 143 appropriate for imprint photolithography is formed on surface 62 of lamina 40. Textured surface 134 of negative template 136 is placed adjacent to surface 62 of lamina 40. These surfaces are adjacent with photoresist 143 between them.

While photoresist 143 is disposed between lamina surface 62 and negative template surface 134, the assembly is exposed to UV light to cure photoresist 143; recall that negative template 136 is preferably transparent. After curing, negative template 136 is removed, leaving a positive relief pattern in photoresist 143. Negative template surface 134 may have been previously treated for easy release.

Figure 12B:
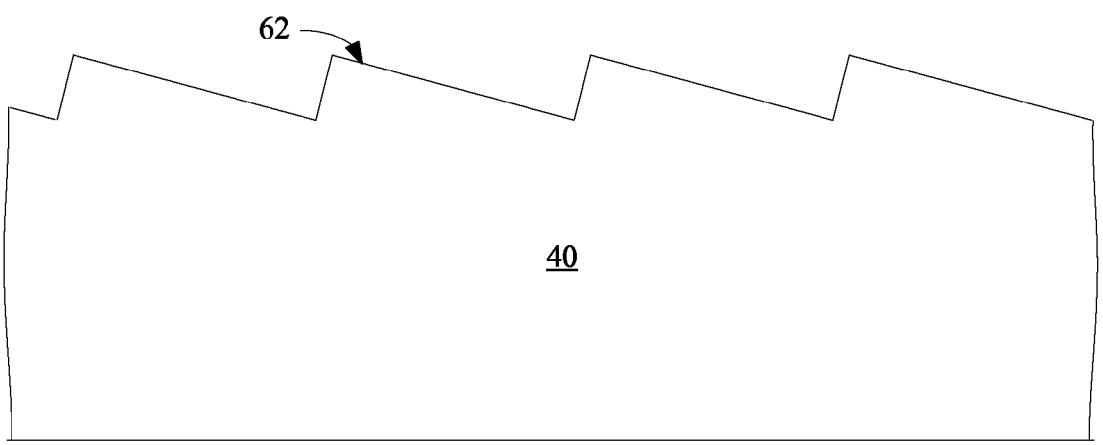

Next, as shown in FIG. 12*b*, a timed etch is performed to transfer the relief formed in photoresist 143 to lamina surface 62. The relief in photoresist 143 is substantially the inverse of the negative relief in negative template surface 134. If the selectivity of photoresist 143 to silicon is 1:1, there will be no vertical exaggeration or compression between the relief formed in photoresist 143 and the final relief formed in lamina surface 62. If there is some etch selectivity, however, there will be some vertical exaggeration or compression.

For simplicity, this example has assumed 1:1 selectivity between resist and silica (during the etch of negative template surface 134) and between resist and silicon (in the etch of lamina surface 62). In reality, the resist may etch more slowly than the silica or silicon, resulting in vertical exaggeration of the transferred relief, or more quickly than the silica or silicon, resulting in vertical compression of the transferred relief. If selectivity between photoresist 133 and silica during the first etch, or between photoresist 143 and silicon during the second etch is not 1:1, the relief can be adjusted accordingly. For example, suppose selectivity between resist and silica is 3:1 and selectivity between resist and silicon is 1:1. Positive template 126 can be cut at 5 degrees from the (111) plane so that after the timed crystallographic etch, the slope of the shallow faces is 5 degrees. The 3:1 photoresist:silica selectivity results in vertical exaggeration, so a 15 degree slope is formed in negative template surface 134. These 15 degree slopes are then transferred from negative template surface 134 to lamina surface 62 with no vertical exaggeration or compression.

Conversely, suppose selectivity is 1:1 between photoresist 133 on the negative template surface and silica, which forms negative template 136, and is 1:2 between photoresist 143 on lamina surface 62 and the silicon of lamina 40. To compensate for this selectivity, positive template 126 is formed with the shallow slopes sloping 30 degrees in positive template surface 124, and this slope is faithfully transferred to negative template surface 134, and from there to photoresist 143 on lamina surface 62. During the etch transferring the slope from resist 143 on lamina surface 62 to lamina surface 62 these 30 degree slopes will be vertically compressed, resulting in 15-degree slope in completed lamina surface 62. As will be appreciated by those skilled in the art, the same resist need not be used for each etch.

After this etch is completed, relief has been transferred into surface 62 of lamina 40, as shown in FIG. 12*b*. After etch, surface 62 is at least 50 percent first faces and second faces, preferably nearly 100 percent. First faces have shallow angles and second faces have steep angles. The first faces include a first subset of first faces having first orientation and a second subset of first faces having a second orientation different from first orientation. The pattern is periodic with pitch between about 0.3 micron and about 3 microns, for example about 1.1 micron.

Positive template 126 can be reused to make multiple negative templates 136, and any negative template 136 can be reused many times to make multiple textured wafers or laminae 40.

EXAMPLE

Texturing with Periodic One-Dimensional Orientation

In some embodiments, it may be preferred for the relief pattern in photovoltaic cell to be one-dimensional rather than two dimensional. As in the two-dimensional example, the process begins with a positive template cut from a (111) oriented wafer at about a 5- to about 30-degree bias, for example at about a 10- to about a 25-degree bias, formed of monocrystalline silicon. Before texturing, the positive template surface has substantially no relief.

As in the two-dimensional example, a material having etch selectivity, for example a layer of about 50 nm of silicon dioxide is formed on a positive template surface of the positive template. Photoresist is formed on the silicon dioxide layer.

Figure 13A:
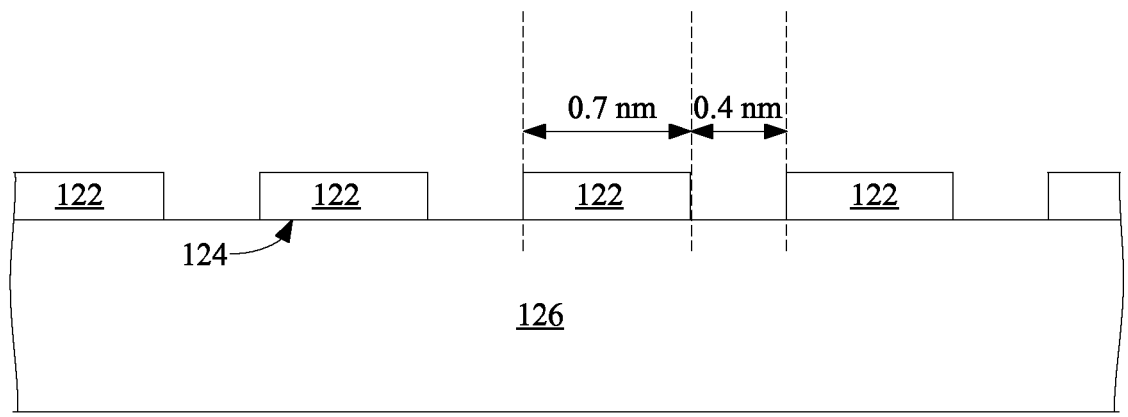
FIGS. 13a and 13b are cross-sectional views showing stages in formation of a textured surface according to an aspect of the present invention having a one-dimensional pattern.

Recall that squares were formed in photoresist 123 in the two-dimensional example previously shown in FIG. 10*b*. In contrast, in a one-dimensional embodiment, stripes are formed in photoresist, and transferred into the silicon dioxide using an isotropic etchant such as HF, and photoresist is removed. Turning to FIG. 13*a*, the stripes in silicon dioxide layer 122 on surface 124 of positive template 126 are 0.7 microns wide with 0.4 micron spacing between.

Figure 13B:
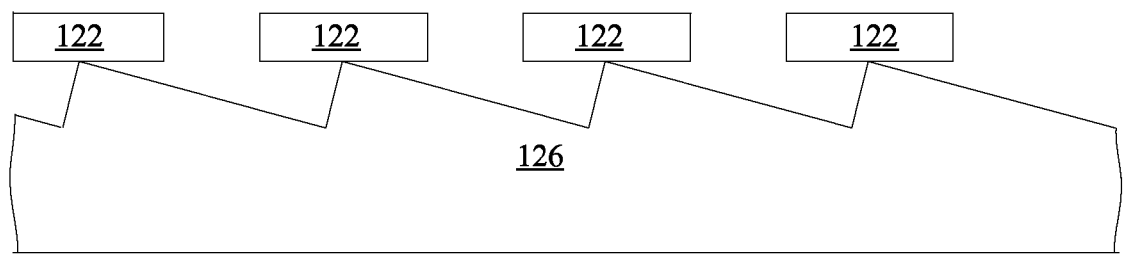
Figure 13C:
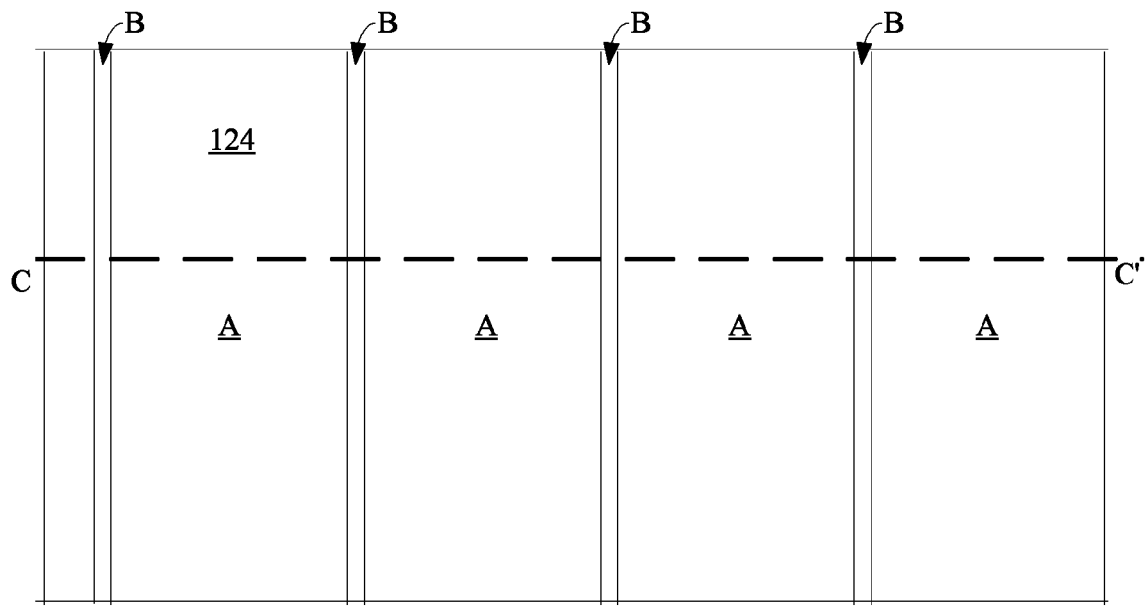
FIG. 13c is a plan view of a textured surface according to an aspect of the present invention having a one-dimensional pattern.
Figure 13D:
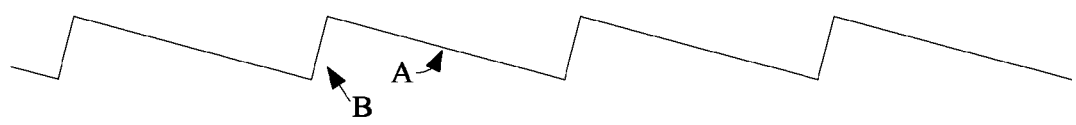
FIG. 13d is a cross-sectional view of the surface of FIG. 13c along line C-C'.

Fabrication proceeds as in two-dimensional example. As shown in FIG. 13*b*, a timed isotropic etch undercuts silicon dioxide stripes 122. After the etch is complete and remaining silicon dioxide 122 is removed, resulting surface 124 is shown from above in FIG. 13*c*. FIG. 13*d* shows a cross-section of positive template 126 along line C-C'. Positive template surface 124 includes first faces A and second faces B. First faces A slope at between about 5 and 30 degrees from horizontal, for example between about 10 and about 25 degrees from horizontal, for example about 15 degrees from horizontal, while faces B are much steeper, for example more than 70 degrees from horizontal. In some embodiments, faces B are nearly vertical, and may be slightly undercut, for example by about 4 or 5 degrees. All first faces A have substantially the same orientation. If the etch has been timed such that no horizontal surfaces remain, the positive template surface, after etch, is made up entirely of first shallow faces and second steep faces. In alternative embodiments, the etched faces may not meet, and some horizontal or other faces may remain.

The result is surface 124 which is at least 50 percent first faces and second faces, preferably nearly 100 percent. The spacing of the first faces is periodic with a pitch of, for example, about 1.1 micron.

If a photovoltaic cell is formed from the textured lamina 40, then, summarizing, the embodiment just described is an example of a photovoltaic cell formed by fabricating a negative template having a negative template surface, the negative template surface having negative template relief; providing a semiconductor lamina having a lamina surface; placing the negative template surface adjacent to the lamina surface, wherein photoresist is disposed between the negative template surface and the lamina surface; and forming lamina relief on the lamina surface, wherein the lamina relief is substantially the inverse of the negative template relief, with or without vertical exaggeration or compression, wherein the photovoltaic cell comprises the semiconductor lamina.

Positive template 126 having a one-dimensional pattern can be used directly to form a photovoltaic cell, or can be used as a template, as in the two-dimensional example, transferring inverse relief from silicon positive template 126 to a silica negative template, then the inverse of the silica negative template to a final wafer or lamina. The positive template and negative template can both be reused many times.

In the embodiments described, the photoresist disposed between the positive template and the negative template, and between the negative template and the final lamina or wafer, is cured at least partially by exposure to light; thus in each curing step one of the two bodies involved must be transparent or semitransparent. In alternative embodiments, a resist may be used which does not require light to cure it; an example might be a resist formed by a sol-gel process. In this case, a single template can be formed, for example a silicon template formed by a crystallographic etch, which can be used to create texture in the target wafer or lamina directly, without the need to form an intermediate template.

EXAMPLE

Formation of Photovoltaic Cell

An example will be provided describing fabrication of a photovoltaic cell comprising a thin semiconductor lamina, as described in Sivaram et al., where the lamina is textured according to embodiments of the present invention.

The process begins with a donor body of an appropriate semiconductor material. An appropriate donor body may be a monocrystalline silicon wafer of any practical thickness, for example from about 300 to about 1000 microns thick. In alternative embodiments, the wafer may be thicker; maximum thickness is limited only by practicalities of wafer handling. Alternatively, polycrystalline or multicrystalline silicon may be used, or wafers or ingots of other semiconductors materials, including germanium, silicon germanium, or III-V or II-VI semiconductor compounds such as GaAs, InP, etc. Multicrystalline or polycrystalline semiconductors are understood to be completely or substantially crystalline, and in all cases at least 80 percent crystalline. In preferred semiconductor donor bodies, the average crystal size of the semiconductor lamina is at least about 1000 angstroms The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 14A:
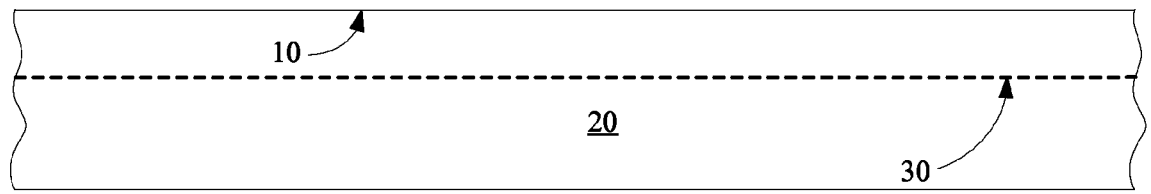
FIGS. 14a-14d are cross-sectional views illustrating stages in formation of a photovoltaic cell comprising a thin lamina, a surface of the thin lamina having an asymmetric textured surface, the surface and the photovoltaic cell formed according to embodiments of the present invention.

Referring to FIG. 14a, donor wafer 20 is formed of monocrystalline silicon which is preferably lightly doped to a first conductivity type. The present example will describe a relatively lightly p-doped wafer 20 but it will be understood that in this and other embodiments the dopant types can be reversed. Dopant concentration may be between about $1 \times 10^{14}$ and $1 \times 10^{18}$ atoms/cm$^3$; for example between about $3 \times 10^{14}$ and $1 \times 10^{15}$ atoms/cm$^3$; for example about $5 \times 10^{14}$ atoms/cm$^3$. Desirable resistivity for p-type silicon may be, for example, between about 133 and about 0.04 ohm-cm, preferably about 44 to about 13.5 ohm-cm, for example about 27 ohm-cm. For n-type silicon, desirable resistivity may be between about 44 and about 0.02 ohm-cm, preferably between about 15 and about 4.6 ohm-cm, for example about 9 ohm-cm.

In embodiments of the present invention, the thickness of the lamina may be between about 0.2 and about 100 microns. Preferred thicknesses include between about 1 and about 80 microns; for example, between about 1 and about 20 microns or between about 2 and about 20 microns. Practically, any thickness in the range between about 0.2 and about 100 microns is achievable; advantageous thicknesses may be between about 1 and about 1.5, 2, 3, 5, 8, 10, 20, or 50 microns.

In some embodiments, diffusion doping may be performed at first surface 10. First surface 10 will be more heavily doped in the same conductivity type as original wafer 20, in this instance p-doped. Doping may be performed with any conventional p-type donor gas, for example $B_2H_6$ or $BCl_3$. In other embodiments, this diffusion doping step can be omitted.

Figure 14B:
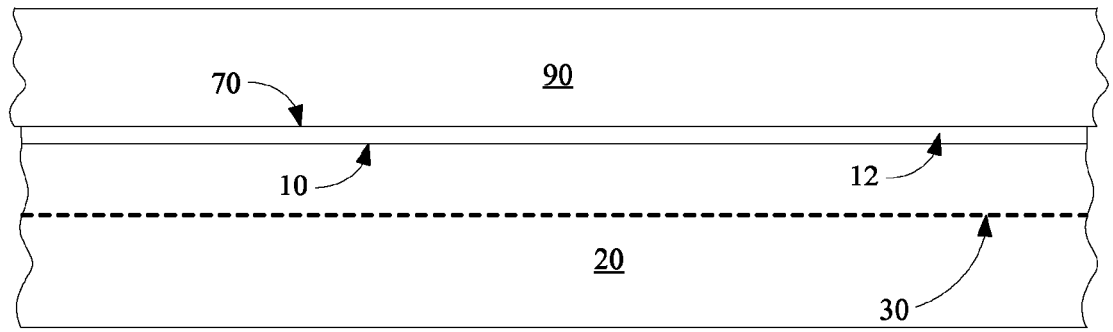

Next ions, preferably hydrogen or a combination of hydrogen and helium, are implanted to define a cleave plane 30, as described more fully in Sivaram et al. Once the implant has been performed, exfoliation will occur once certain conditions, for example elevated temperature, are encountered. It is necessary, then, to keep processing temperature and duration below those which will initiate exfoliation until exfoliation is intended to take place. In general, exfoliation is more readily controlled, and the lamina is more easily handled, if the first surface 10, through which the implant was performed, is affixed to a receiver element of some sort to provide mechanical support. This receiver element may be any appropriate material, such as semiconductor, glass, metal, or polymer. Referring to FIG. 14b, in the present example, the receiver element 90 to which first surface 10 is affixed may be borosilicate glass or some other material that can tolerate relatively high temperature.

Herner et al., U.S. patent application Ser. No. 12/057,265, "Method to Form a Photovoltaic Cell Comprising a Thin Lamina Bonded to a Discrete Receiver Element," filed Mar. 27, 2008, owned by the assignee of the present invention and hereby incorporated by reference, describes affixing first surface 10 of donor wafer 20 to a surface 70 of receiver element 90, surface 70 having a receiver maximum width. First surface 10 of donor wafer 20 has a donor maximum width. The receiver maximum width is no more than about 50 percent of the donor maximum width, and the two widths are preferably about the same.

A reflective metallic material, for example titanium or aluminum, should contact first surface 10. Other alternatives for such a layer, in this and other embodiments, include chromium, molybdenum, tantalum, zirconium, vanadium, or tungsten. In some embodiments, it may be preferred to deposit a thin layer 12 of aluminum onto first surface 10. For example, aluminum can be sputter deposited onto first surface 10. Alternatively, the surface of receiver element 90 may be coated with aluminum or some other reflective metallic material. Subsequent thermal steps will soften the aluminum, causing it to flow and make good contact with first surface 10. In other embodiments, an aluminum layer can be formed on both first surface 10 and on receiver element 90.

Figure 14C:
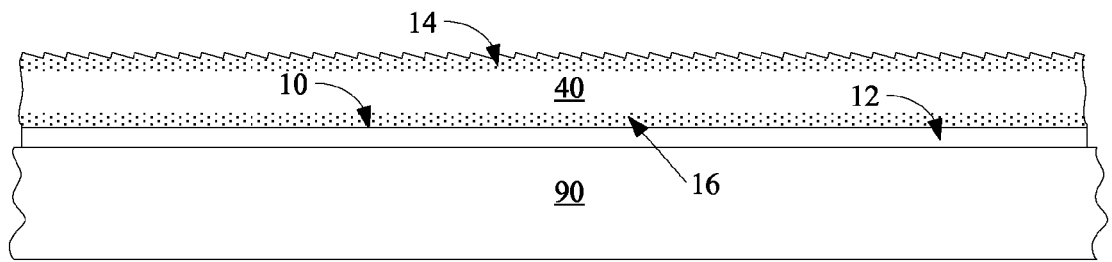

Turning to FIG. 14c, lamina 40 can now be cleaved from donor wafer 20 at cleave plane 30 as described earlier. Second surface 62 has been created by exfoliation. In FIG. 14c, the structure is shown inverted, with receiver element 90 on the bottom.

Surface 62 of lamina 40 can now be textured using the methods of the present invention described earlier. For example, a previously formed negative template (not shown) may be placed adjacent to surface 62 with photoresist disposed between them. After curing, the photoresist is etched to form the relief described earlier. After this texturing step, at least 50 percent of surface 62 will consist of first faces and second faces, the first faces sloping between about 5 and about 30 degrees from horizontal, preferably between about 10 and about 25 degrees from horizontal, and the second faces sloping at about 70 degrees or more. In preferred embodiments, more than 90 percent of the area of surface 62 will consist of these first and second faces.

Note that before formation of texture according to the present invention, surface 62 likely will not be perfectly smooth, as the process of exfoliation may produce some surface relief. This relief will generally be less than the depth of the shallow-sloped texture being formed, though. If the etch selectivity of photoresist to silicon is close to 1:1, the preexisting roughness will not affect the final profile. Thus etch selectivity close to 1:1 between photoresist and silicon during this step is preferred.

If metal 12 is a p-type acceptor such as aluminum, annealing at this point or later may serve to form or additionally dope p-doped region 16 by causing metal atoms from metal layer 12 to diffuse into region 16.

Next a region 14 at the top of lamina 40 is doped through second surface 62 to a conductivity type opposite the conductivity type of the original wafer 20. In this example, original wafer 20 was lightly p-doped, so doped region 14 will be n-type. This doping may be performed by any conventional means. In preferred embodiments this doping step is performed by diffusion doping using any appropriate donor gas that will provide an n-type dopant, for example $POCl_3$.

Diffusion doping is typically performed at relatively high temperature, for example between about 700 and about 900 degrees C., although lower temperature methods, such as plasma enhanced diffusion doping, can be performed instead. This elevated temperature will cause some aluminum from aluminum layer 12 to diffuse in at first surface 10. This elevated temperature can serve as the anneal mentioned earlier to form a more heavily doped p-type region 16 which will serve to form a good electrical contact to aluminum layer 12. If doping of p-region 16 from aluminum layer 12 is sufficient, the earlier diffusion doping step performed at first surface 10 to form this region can be omitted. If oxygen is present during the n-type diffusion doping step, a thin layer of silicon dioxide (not shown) will form at second surface 62. FIG. 14c shows the structure at this point.

Figure 14D:
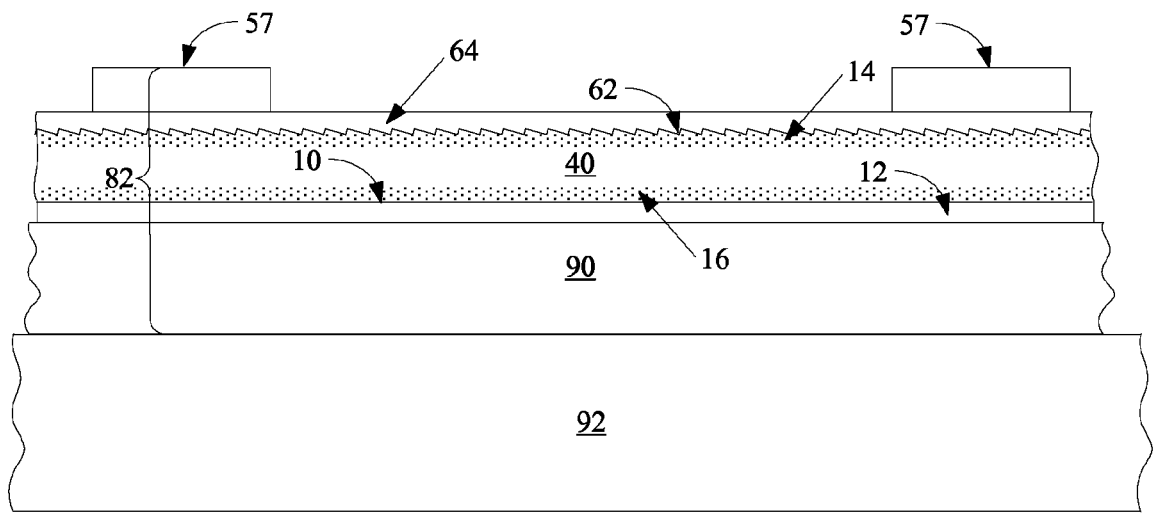

Turning to FIG. 14d, antireflective layer 64 is preferably formed, for example by deposition or growth, on second surface 62. Incident light enters lamina 40 through second surface 62; thus this layer should be transparent. In some embodiments antireflective layer 64 is silicon nitride, which has a refractive index of about 1.5 to 3.0; its thickness would be, for example, between about 500 and 2000 angstroms, for example about 650 angstroms.

Next wiring 57 is formed on layer 64. In some embodiments, this wiring is formed by screen printing conductive paste in the pattern of wiring, which is then fired at high temperature, for example between about 700 and about 900 degrees C. For example, if layer 64 is silicon nitride, it is known to screen print wiring using screen print paste containing silver. During firing, some of the silver diffuses through the silicon nitride, effectively forming a via through the insulating silicon nitride 64, making electrical contact to n-doped silicon region 14. Contact can be made to the silver remaining above antireflective layer 64.

Figure 15:
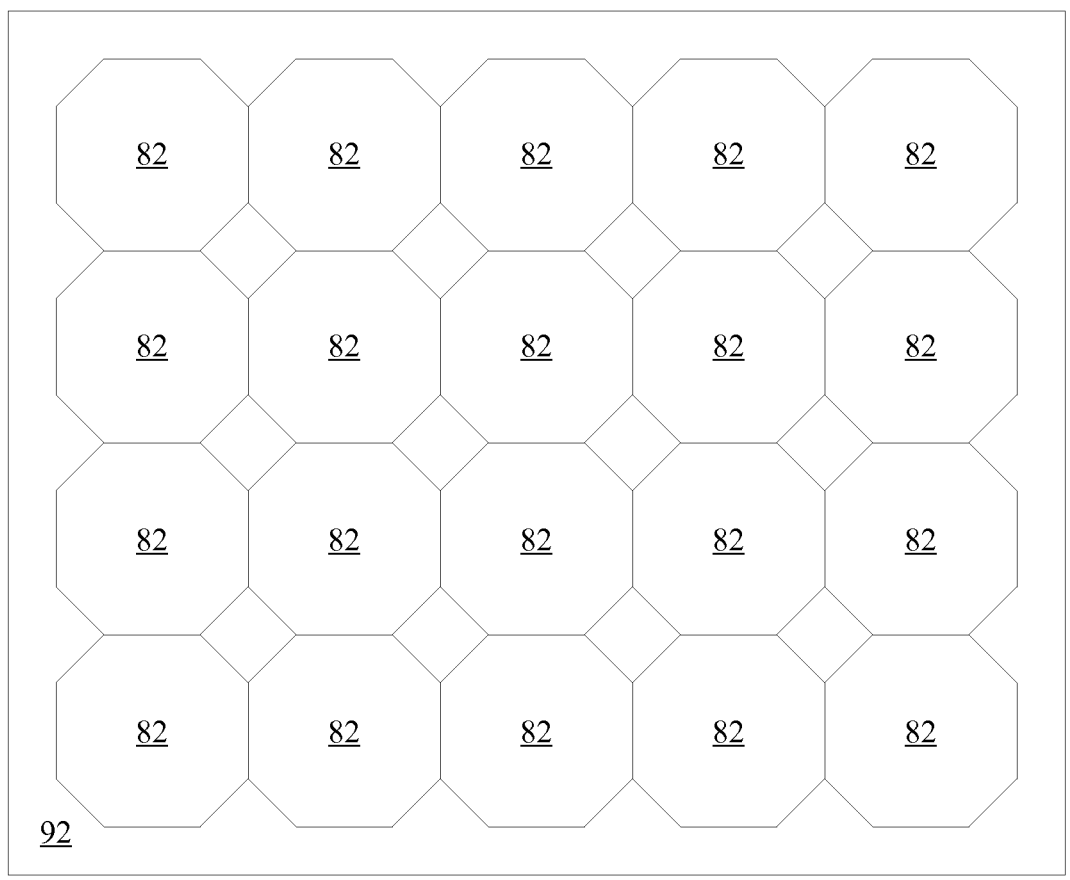
FIG. 15 is a plan view of a photovoltaic module formed according to an embodiment of the present invention.

As described in Herner et al., a photovoltaic assembly 82 has been formed including a semiconductor lamina 40 and receiver element 90, where the photovoltaic assembly 82 comprises a photovoltaic cell. The semiconductor lamina 40 comprises at least a portion of the base or emitter of the photovoltaic cell, or, in this case, both. The photovoltaic assembly 82 can be affixed to a substrate or superstrate, for example to substrate 92 as shown in FIG. 14d. A plurality of photovoltaic assemblies 82 can be assembled into a photovoltaic module, as shown in FIG. 15. For example, each photovoltaic assembly can be affixed to a substrate 92, the cells connected in series.

What has just been formed is a photovoltaic cell comprising a semiconductor lamina having a first textured surface and a second surface substantially parallel to the first textured surface, wherein at least 50 percent of the first textured surface area is first faces and second faces, wherein the first faces are at an angle between about 5 and about 30 degrees from horizontal, and the second faces are at least seventy degrees from horizontal, wherein the photovoltaic cell comprises the semiconductor lamina. In some embodiments the spacing of the first faces is periodic, while in others it is not periodic.

In preferred embodiments, to maximize internal reflection, the back surface of semiconductor lamina 40, which is surface 10, or the front surface of receiver element 90, or a layer disposed between the surface 10 and receiver element 90, is reflective. The majority of light initially enters semiconductor lamina 40 at the first textured surface 62.

Several other examples of photovoltaic cells fabricated using a thin semiconductor lamina are described in Sivaram et al. and in Herner et al., and any of these embodiments may be formed having a textured surface where the surface includes asymmetric first and second faces, the first faces sloping between 5 and 30 degrees from horizontal, with a one-dimensional or two-dimensional pattern, and either periodic or non-periodic, as described in the present application.

EXAMPLE

Textured Cell Affixed to Superstrate

The example just provided described a photovoltaic cell comprising a thin semiconductor lamina. The lamina was affixed to a substrate receiver element, and the front surface of the cell was textured according to embodiments of the present invention. Light entered the exemplary cell at the textured surface.

For clarity, another example will be provided, this one describing fabrication of a photovoltaic cell comprising a thin semiconductor lamina, the lamina affixed to a superstrate receiver element. In this example the back surface of this cell will be textured according to embodiments of the present invention.

Figure 16A:
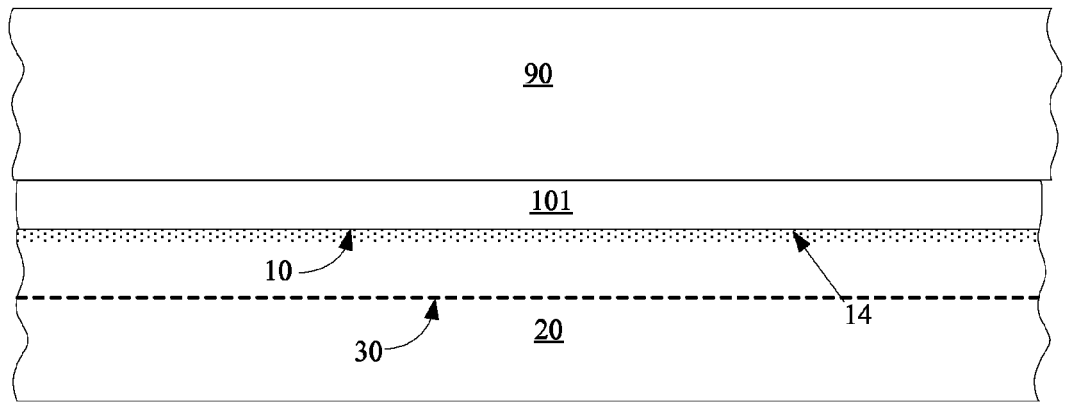
FIGS. 16a and 16b are cross-sectional views illustrating stages in formation of a photovoltaic cell comprising a thin lamina, a surface of the thin lamina having an asymmetric textured surface, the surface and the photovoltaic cell formed according to additional embodiments of the present invention.

Turning to FIG. 16a, fabrication begins with lightly doped p-type donor wafer 20. First surface 10 of donor wafer 20 is doped with an n-type dopant, for example by diffusion doping, to form n-type region 14. Next ions, preferably hydrogen or a combination of hydrogen and helium, are implanted through first surface 10 of donor wafer 20 to define a cleave plane 30, as described earlier. First surface 10 is then affixed to receiver element 90, which is a transparent material such as glass. A conductive material 101, for example a transparent conductive oxide (TCO), is disposed between first surface 10 and receiver element 90. Appropriate TCOs include indium tin oxide, tin oxide, titanium oxide, zinc oxide, etc.

Figure 16B:
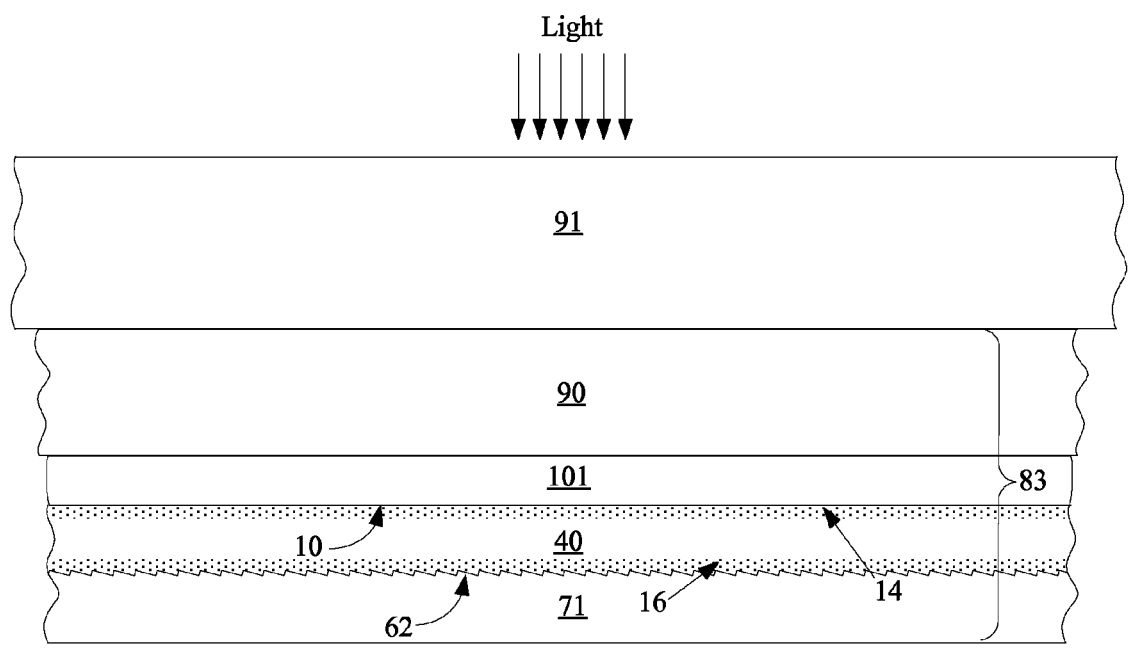

Referring to FIG. 16b, lamina 40 can now be cleaved from donor wafer 20 at cleave plane 30 as described earlier. Second surface 62 has been created by exfoliation. Surface 62 of lamina 40 can now be textured using the methods of the present invention described earlier. For example, a previously formed negative template (not shown) may be placed adjacent to surface 62 with photoresist disposed between them. After curing, the photoresist is etched to form the relief described earlier. After this texturing step, at least 50 percent of surface 62 will consist of first faces and second faces, the first faces sloping between about 5 and about 30 degrees from horizontal, preferably between about 10 and about 25 degrees from horizontal, and the second faces sloping at about 70 degrees or more. In preferred embodiments, more than 90 percent of the area of surface 62 will consist of these first and second faces.

Next surface 62 is doped, for example by diffusion doping with a p-type dopant to form p-doped region 16. Conductive material 71 is deposited on surface 62. Conductive material 71 is preferably reflective. In some embodiments, it may be preferred for conductive material 71 to be a non-reflective TCO, and to form a reflective material on conductive material 71. A photovoltaic assembly 83 has been formed comprising receiver element 90 and semiconductor lamina 40. Photovoltaic assembly 83 comprises a photovoltaic cell. Multiple photovoltaic assemblies 83 can be affixed to superstrate 91, which is transparent, forming a photovoltaic module.

In this embodiment, the majority of light initially enters semiconductor lamina 40 at first surface 10, and is reflective from textured surface 62, or from an adjacent reflective layer.

EXAMPLE

Textured Surface Affixed to Receiver Element

In both of the previous embodiments, a first surface of a donor wafer was affixed to a receiver element, a lamina was cleaved from the donor wafer, creating a second surface, and the second surface was textured. In general a good bond between the first surface of the donor wafer and the surface of the receiver element is helpful in achieving uniform exfoliation to create a contiguous lamina, with few or no flaws or voids. If these bonded surfaces have minimal relief, a strong and consistent bond is more readily formed. If, however, one of these surfaces is to be textured, care must be taken to assure good bonding. An embodiment of the present invention will be described in which a textured surface is affixed to a receiver element.

Figure 17A:
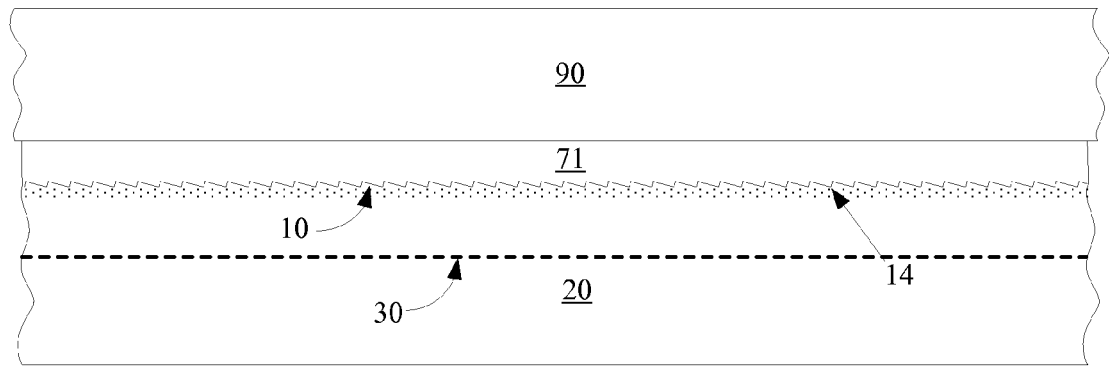
FIGS. 17a-17d are cross-sectional views illustrating stages in formation of a photovoltaic cell comprising a thin lamina, a surface of the thin lamina having an asymmetric textured surface, the surface and the photovoltaic cell formed according to additional embodiments of the present invention.

Referring to FIG. 17a, in the present embodiment a first surface 10 of a lightly doped donor wafer 20 may be heavily doped to create heavily doped region 14. Next ions, preferably hydrogen or a combination of hydrogen and helium, are implanted through first surface 10 of donor wafer 20 to define a cleave plane 30, as in earlier embodiments.

After implant, first surface 10 of donor wafer 20 is textured according to embodiments of the present invention, as described earlier. For example, a previously formed negative template (not shown) may be placed adjacent to surface 10 with photoresist disposed between them. After curing, the photoresist is etched to form the relief described earlier. After this texturing step, at least 50 percent of surface 10 will consist of first faces and second faces, the first faces sloping between about 5 and about 30 degrees from horizontal, preferably between about 10 and about 25 degrees from horizontal, and the second faces sloping at about 70 degrees or more. In preferred embodiments, more than 90 percent of the area of first surface 10 will consist of these first and second faces.

Figure 17B:
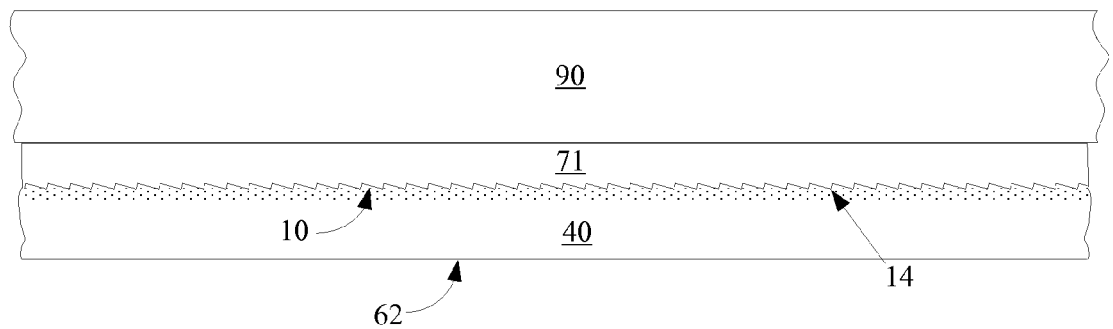

Next TCO 71 is formed on textured first surface 10. In some embodiments, TCO 71 is a sol-gel zinc oxide, which is spun on. After filling in the relief of textured surface 10, TCO 71 will tend to be self-planarizing, forming a substantially planar surface. This substantially planar surface is affixed to receiver element 90. FIG. 17a shows the structure at this point. Referring to FIG. 17b, after affixing, lamina 40 is cleaved from donor wafer 20 at cleave plane 30, creating second surface 62, as in prior embodiments.

Figure 17C:
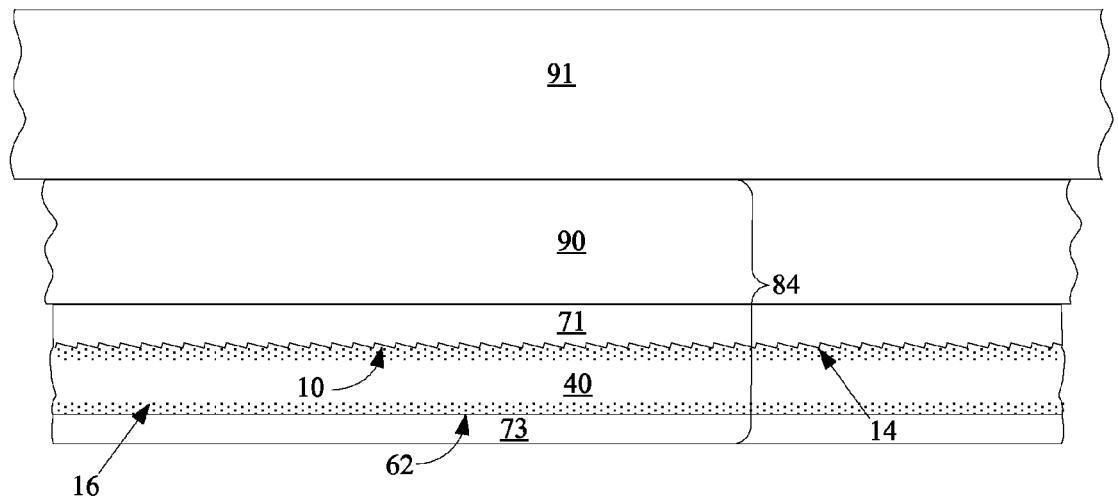

There are many options for additional processing, only two of which will be described here. As shown in FIG. 17c, if receiver element 90 is transparent, it can serve as a superstrate, and textured surface 10 will be the front surface of the cell. Back surface 62, which was formed by cleaving, can be doped to form heavily doped region 16, then coated with or affixed to a reflective material 73. Back surface 62 may optionally be textured as well. Photovoltaic assembly 84 includes lamina 40 and receiver element 90. Photovoltaic assembly 84 can be affixed along with other photovoltaic assemblies 84 to transparent superstrate 91, forming a photovoltaic module. Alternatively, photovoltaic assembly 84 can be affixed to a substrate module (not shown).

Figure 17D:
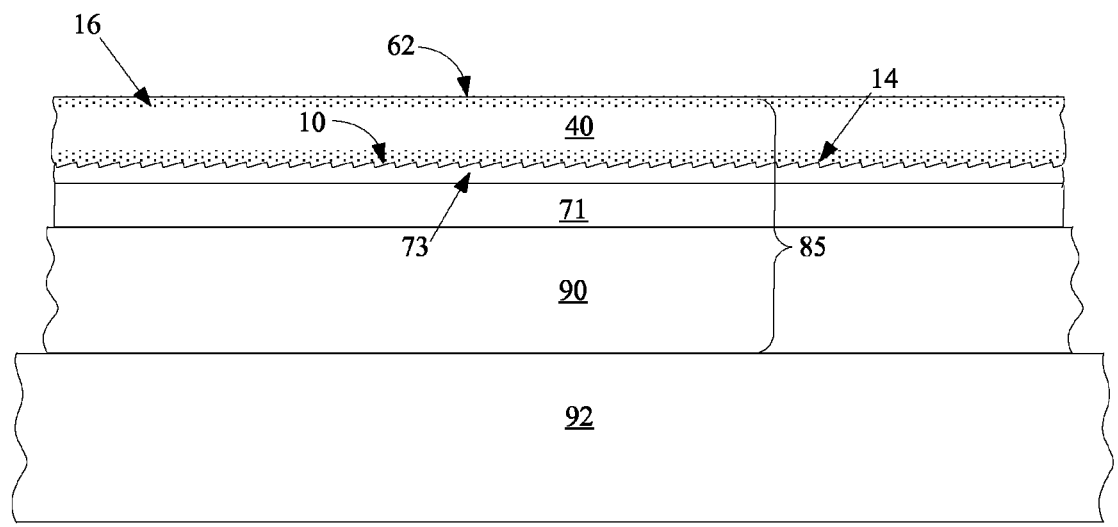

In another alternative, shown in FIG. 17d, receiver element 90 serves as a substrate. FIG. 17d shows the structure inverted, with receiver element 90 at the bottom. In this embodiment, textured first surface 10 may have been coated with a reflective material 73 before deposition of TCO 71. Textured first surface 10 serves as the back surface of the cell, while second surface 62, which was created by the cleaving step, is the front surface. Electrical connection to second surface 62 is formed by any suitable method. Photovoltaic assembly 85, which includes lamina 40 and receiver element 90, can be affixed with other photovoltaic assemblies 85 to substrate 92 (as shown) or to a superstrate, forming a photovoltaic module. In both of these embodiments, some additional fabrication steps have been omitted to avoid obscuring the invention.

This embodiment and the previous ones are examples of a first photovoltaic assembly comprising a semiconductor lamina having a thickness between about 0.5 and about 20 microns, the semiconductor lamina having a first textured surface and second surface substantially parallel to the first textured surface, wherein at least 50 percent of the first textured surface area is first faces and second faces, wherein the first faces are at an angle between ten and twenty-five degrees from horizontal, and the second faces are at least seventy degrees from horizontal, wherein the semiconductor lamina has a lamina widest dimension. The photovoltaic assembly also comprises a receiver element having a receiver widest dimension, wherein the semiconductor lamina is affixed to the receiver element at the second surface, wherein the receiver widest dimension does not exceed the lamina widest dimension by more than about 50 percent, wherein the first photovoltaic assembly comprises a photovoltaic cell.

EXAMPLE

Textured Receiver Element

In the previous embodiments, a surface of the semiconductor lamina itself is textured. In other embodiments, a surface of the receiver element may instead be textured.

Figure 18A:
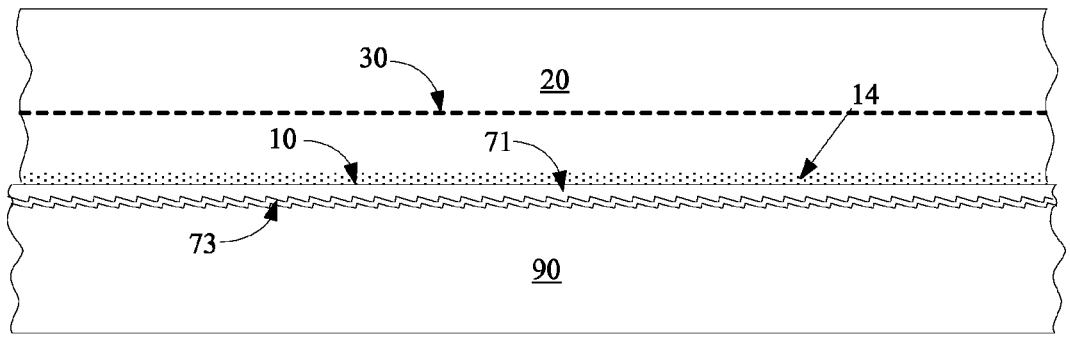
FIGS. 18a and 18b are cross-sectional views illustrating stages in formation of a photovoltaic cell comprising a thin lamina, wherein a surface within the cell is textured according to an additional embodiment of the present invention.

Turning to FIG. 18a, the surface of a receiver element 90 is textured according to methods of the present invention. After texturing, at least 50 percent of its surface will consist of first faces and second faces, the first faces sloping between about 5 and about 30 degrees from horizontal, preferably between about 10 and about 25 degrees from horizontal, and the second faces sloping at about 70 degrees or more. If receiver element 90 is formed of a transparent material, such as glass, it can be formed by disposing photoresist between it and a template crystallographically etched in silicon, with no need for a second template. Alternatively, receiver element 90 may be formed of a reflective material, or its surface may be coated with a reflective material which is textured.

In the present example, receiver element 90 is glass, and after texturing, the textured surface is coated with reflective layer 73. This layer should be sufficiently thin and conformal to preserve the texturing formed at the surface of receiver element 90. Next TCO 71 is deposited on reflective layer 73. As in the prior embodiment, TCO 71 is a conductive material which tends to self-planarize after filling the relief of the textured surface of receiver element 90, such as a sol-gel zinc oxide. The substantially planar surface of TCO 71 is affixed to donor wafer 20 at first surface 10. In this embodiment, first surface 10 has little or no relief. Cleave plane 30 has previously been formed in donor wafer 20, for example by implantation of hydrogen and helium ions, and heavily doped region 14 has previously been formed at the surface of donor wafer 20.

Figure 18B:
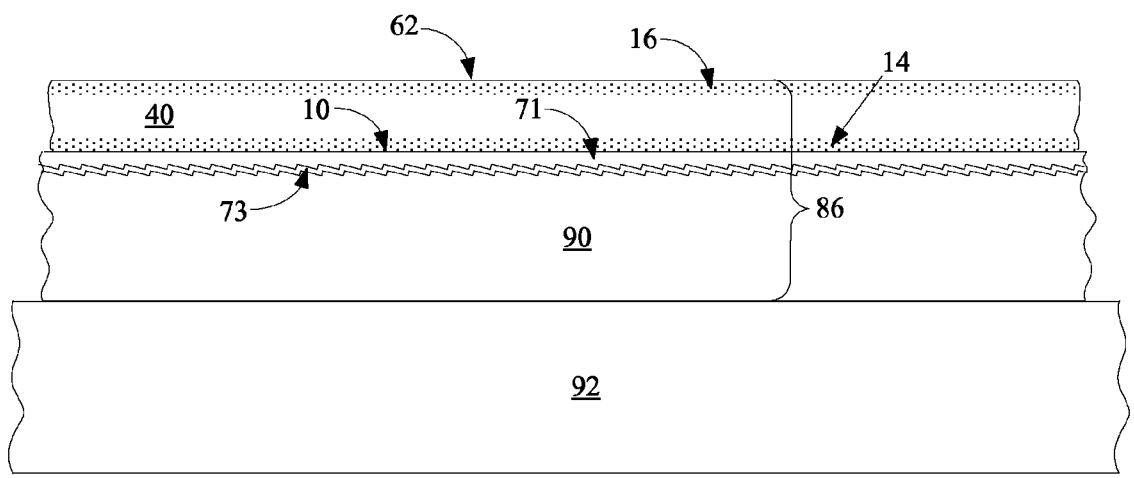

Turning to FIG. 18b, semiconductor lamina 40 is cleaved from donor wafer 20 at cleave plane 30, forming second surface 62. Second surface 62 may or may not be textured, and may be doped to form heavily doped region 16. Additional processing completes the photovoltaic assembly 86 shown in FIG. 18b, which includes semiconductor lamina 40 and receiver element 90. Photovoltaic assembly 86 comprises a photovoltaic cell. Incident light enters the cell at second surface 62, and is reflected from the textured surface of receiver element 90 at the back of the photovoltaic cell. Multiple photovoltaic assemblies 86 can be affixed to a single substrate 92 (or superstrate, not shown) to form a photovoltaic module. Some fabrication steps, such as formation of electrical contact to second surface 62, have been omitted to avoid obscuring the invention, but may be completed as in prior embodiments, or as in embodiments of Sivaram et al. or Herner et al.

Summarizing, this and prior embodiments describe a photovoltaic cell, wherein incident light enters the photovoltaic cell at a front surface, and at least a fraction of the incident light is reflected from a back surface, wherein the incident light is reflected or refracted at a textured surface, wherein the textured surface is the front surface, the back surface, or a third surface between the front surface and the back surface, wherein at least 50 percent of the textured surface comprises first faces and second faces, wherein the first faces are at an angle between ten and twenty-five degrees from horizontal, and the second faces are at least seventy degrees from horizontal. In the embodiment just described, the textured surface is the back surface of the cell, and is coincident with a surface of the receiver element.

A variety of embodiments has been provided for clarity and completeness. Clearly it is impractical to list all embodiments. Other embodiments of the invention will be apparent to one of ordinary skill in the art when informed by the present specification.

The examples provided have described the use of silicon in both the positive template, which is subjected to a crystallographic etch, and the semiconductor lamina, which is part or all of the finished photovoltaic cell. Other semiconductor materials, such as germanium and silicon-germanium, among others, could be used instead.

Several of the detailed examples provided have described a textured surface having an asymmetric profile including a shallow face, the textured surface formed on a thin semiconductor lamina between about 0.5 and about 100 microns thick, for example between about 1 and about 20 microns thick, formed of substantially crystalline silicon. A surface formed according to the present invention could also be formed and provide utility in light-trapping at the surface of other semiconductor bodies, such as monocrystalline, multi-crystalline, or polycrystalline silicon wafers which are more than 100 microns thick, for example between 120 microns thick and 350 microns thick. Similarly, surface texturing according to the present invention could be used in amorphous, nanocrystalline, and microcrystalline films.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to form a photovoltaic cell, the method comprising:
   defining a cleave plane in a monocrystalline semiconductor donor body;
   affixing a first surface of the semiconductor donor body to a receiver element;
   cleaving a monocrystalline semiconductor lamina from the semiconductor donor body along the cleave plane, the semiconductor lamina having a thickness between about 0.5 and about 50 microns,
     wherein the semiconductor lamina remains affixed to the receiver element,
     wherein the cleaving step creates a second surface of the semiconductor lamina substantially parallel to the first surface; and
   treating the second surface, the treating step comprising:
     fabricating a negative template having a negative template surface, the negative template surface having negative template relief;
     placing the negative template surface adjacent to the second surface, wherein photoresist is disposed between the negative template surface and the second surface; and
     forming lamina relief on the second surface, wherein the lamina relief is substantially the inverse of the negative template relief, with or without vertical exaggeration or compression.

2. The method of claim 1, wherein the thickness of the semiconductor lamina is between about 0.5 and about 30 microns.

3. The method of claim 1, wherein the thickness of the semiconductor lamina is between about 0.5 and about 20 microns.

4. The method of claim 1 wherein the semiconductor lamina is substantially silicon.

5. The method of claim 1, wherein the photovoltaic cell comprises the semiconductor lamina.

6. The method of claim 1 wherein the semiconductor lamina comprises at least a portion of a base of the photovoltaic cell.

7. The method of claim 1, wherein, after the step of treating the second surface, at least 50 percent of the second surface is first faces and second faces, wherein the first faces are at an angle between ten and twenty-five degrees from horizontal, and the second faces are at least seventy degrees from horizontal.

8. The method of claim 1 wherein the negative template is formed of a transparent or semitransparent material.

9. The method of claim 1 wherein the step of forming lamina relief on the second surface comprises:
    curing the photoresist while it is disposed between the negative template and the lamina; and
    etching the photoresist.

10. The method of claim 9 wherein the negative template is formed of a transparent or semitransparent material, and wherein the step of curing the photoresist comprises exposing the photoresist to ultraviolet light.

11. The method of claim 1 wherein the step of fabricating a negative template having a negative template surface comprises:
    forming a positive template having a positive template surface, the positive template surface having positive relief;
    providing the negative template, wherein the negative template has a negative template surface, the negative template surface being substantially absent of relief;
    placing the positive template surface adjacent to the negative template surface with photoresist disposed between the positive template surface and the negative template surface; and
    forming negative relief on the negative template surface, wherein the negative relief is substantially the inverse of the positive relief, with or without vertical exaggeration or compression.

12. The method of claim 11 wherein the positive template is a monocrystalline silicon wafer.

13. The method of claim 12 wherein the step of forming the positive template comprises sawing the monocrystalline silicon wafer from an ingot at an angle between about ten and about twenty-five degrees from the {111} crystallographic plane.

* * * * *